United States Patent
Ohnuma

(10) Patent No.: US 7,524,593 B2
(45) Date of Patent: Apr. 28, 2009

(54) EXPOSURE MASK

(75) Inventor: Hideto Ohnuma, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 437 days.

(21) Appl. No.: 11/462,824

(22) Filed: Aug. 7, 2006

(65) Prior Publication Data

US 2007/0037069 A1 Feb. 15, 2007

(30) Foreign Application Priority Data

Aug. 12, 2005 (JP) ............................. 2005-234906

(51) Int. Cl.
*G03F 1/00* (2006.01)
*G03C 5/00* (2006.01)
(52) U.S. Cl. .......................................... 430/5; 430/311
(58) Field of Classification Search .................... 430/5, 430/394; 716/19, 20, 21
See application file for complete search history.

(56) References Cited

U.S. PATENT DOCUMENTS

| | | | |
|---|---|---|---|
| 4,818,715 A | 4/1989 | Chao | |
| 5,371,025 A | 12/1994 | Sung | |
| 5,744,381 A | 4/1998 | Tabata et al. | |
| 6,071,652 A | 6/2000 | Feldman et al. | |
| 6,080,512 A * | 6/2000 | Ina ................................ | 430/5 |
| 6,365,917 B1 | 4/2002 | Yamazaki | |
| 6,420,073 B1 | 7/2002 | Suleski et al. | |
| 6,515,336 B1 | 2/2003 | Suzawa et al. | |
| 6,534,425 B1 | 3/2003 | Karr et al. | |
| 6,534,826 B2 | 3/2003 | Yamazaki | |
| 6,541,294 B1 | 4/2003 | Yamazaki et al. | |
| 6,613,620 B2 | 9/2003 | Fujimoto et al. | |
| 6,638,667 B2 | 10/2003 | Suleski et al. | |
| 6,646,287 B1 | 11/2003 | Ono et al. | |
| 6,660,462 B1 | 12/2003 | Fukuda | |
| 6,664,145 B1 | 12/2003 | Yamazaki et al. | |
| 6,707,068 B2 | 3/2004 | Fujimoto et al. | |
| 6,773,996 B2 | 8/2004 | Suzawa et al. | |

(Continued)

FOREIGN PATENT DOCUMENTS

EP    1 003 223 A2    5/2000

(Continued)

OTHER PUBLICATIONS

Kim et al.; "A Novel Four-Mask-Count Process Architecture for TFT-LCDs"; *SID 00 Digest*; pp. 1006-1009; 2000.

*Primary Examiner*—Stephen Rosasco
(74) *Attorney, Agent, or Firm*—Fish & Richardson P.C.

(57) ABSTRACT

An exposure mask provided with a semi-transparent film, capable of forming a resist in which a convex portion is not formed in an end portion and the end portion has gentle shape. In an exposure mask having a first region and a second region having different phase and transmittance with respect to exposure light, the phase difference $\Delta\theta$ with respect to exposure light which transmits though the first region and the second region and the transmittance n of the second region with respect to exposure light are defined so as to satisfy following formula 1.

$$\Delta\theta \leq \arccos(-\sqrt{n}/2) \qquad [\text{Formula 1}]$$

Accordingly, a resist having regions with different thicknesses and having gentle shape in an edge can be formed. By performing a process such as etching with this resist, regions having different thicknesses can be formed in a self-aligned manner.

13 Claims, 12 Drawing Sheets

U.S. PATENT DOCUMENTS

| | | |
|---|---|---|
| 6,828,586 B2 | 12/2004 | Fujimoto et al. |
| 6,872,604 B2 | 3/2005 | Yamazaki et al. |
| 6,884,664 B2 | 4/2005 | Fujimoto et al. |
| 6,909,114 B1 | 6/2005 | Yamazaki |
| 2001/0019127 A1 | 9/2001 | Ishida |
| 2002/0025591 A1 | 2/2002 | Ohnuma et al. |
| 2002/0146627 A1 | 10/2002 | Suleski et al. |
| 2004/0065902 A1 | 4/2004 | Yamazaki et al. |
| 2005/0161672 A1 | 7/2005 | Yamazaki et al. |
| 2005/0161674 A1 | 7/2005 | Fujimoto et al. |
| 2006/0014335 A1 | 1/2006 | Ohnuma et al. |

FOREIGN PATENT DOCUMENTS

| | | |
|---|---|---|
| EP | 1 058 311 A2 | 12/2000 |
| JP | 08-078329 | 3/1996 |
| JP | 10-032327 | 2/1998 |
| JP | 2002-151523 | 5/2002 |

* cited by examiner

PRIOR ART

EXPOSURE MASK

BACKGROUND OF THE INVENTION

1. Field of the Invention

The present invention relates to an exposure mask, and particularly relates to optimal conditions of phase difference and transmittance of an exposure mask.

2. Description of the Related Art

Note that in this specification, a "semiconductor device" refers to any device that utilizes semiconductor characteristics to function, and electro-optical devices, semiconductor circuits and electronic devices are all included in the category of the semiconductor device.

An active matrix type liquid crystal or an EL display technique of utilizing thin film transistors (TFTs) has been in the spotlight in recent years. An active matrix display is advantageous compared to a passive matrix display in response speed and contrast.

For such a semiconductor device having a display, various TFTs of which roles are different have been used depending on its use application and function; an LDD (Lightly Doped Drain) structure which realizes a small off-current value, a GOLD (Gate Overlapped LDD) structure having a region where a gate electrode and an LDD region are overlapped, which is superior as a measure against hotcarriers, a single-drain structure, and the like have been used.

Conventionally, an LDD region and a GOLD region have been formed in a self-aligned manner with a gate electrode as a mask, which is advantageous in that increase in the number of photolithography steps can be suppressed.

In case, the formation of an LDD structure and a GOLD structure is performed by using only a process such as dry etching; thus, a single drain structure, an LDD structure, and a GOLD structure cannot be formed separately for each circuit.

Further, in the case of forming an LDD region by using a step of forming a spacer (also called a sidewall) on a side wall of a gate electrode, the manufacturing steps would become complex.

As a method for solving the above problems, a photomask or a reticle provided with an assistant pattern (a halftone film) having a function of reducing light intensity, which is made of a semi-transparent film is used in a photolithography step of forming a gate electrode, thereby transistors having an LDD structure, a GOLD structure, and a single-drain structure are formed for respective circuits (reference 1: Japanese Patent Laid-Open No. 2002-151523). Note that such a photomask or a reticle provided with a halftone film is called an exposure mask (a halftone mask).

In the case where a resist for obtaining a desired gate electrode by using the above-mentioned halftone mask, shape of the resist depends on the phase difference and the transmittance with respect to exposure light, of the halftone mask. Therefore, the transmittance and the phase difference of exposure light are required to be controlled.

For example, a shape of a resist required for obtaining a gate electrode with which an LDD region can be formed in a self-aligned manner is a shape where a central portion of the resist has a region with a certain thickness, a region including both end portions of the resist has a region with a smaller thickness than the central portion, and both the end portions have gentle slope.

FIG. 12 shows a resist shape manufactured by using a halftone mask formed in such a condition that the transmittance of i-line (365 nm), n=0.2 (or also defined as T=20%), and the phase difference of i-line, ($\Delta\theta$)=130°. As indicated by arrows, both end portions of the resist are convex. When a conductive layer is etched using the resist shown in FIG. 12 to form a gate electrode, the conductive layer becomes thick locally under the convex portion. As a result, in a doping step to a semiconductor layer which is performed after the formation of the gate electrode, the carrier concentration in a semiconductor layer provided in a layer under the locally-thick conductive layer is locally changed.

The following is considered as a reason thereof; exposure light which transmits through a transparent region of the halftone mask and exposure light which transmits through a halftone film (semi-transparent region), interfere with each other, and intensity of the exposure light which transmits through a boundary portion of the halftone film is decreased, thereby a convex portion is formed in an end portion of the resist (boundary portion of the halftone film).

SUMMARY OF THE INVENTION

In view of solving the foregoing problems, it is an object of the present invention to propose an optimal condition of a halftone mask for obtaining a resist having different thicknesses without forming a convex portion in its end portion.

According to the invention, a phase difference $\Delta\theta$ of exposure light which transmits through a transparent region and a semi-transparent region and a transmittance n of the semi-transparent region with respect to the exposure light satisfy the following formula 1.

$$\Delta\theta \leq \arccos(-\sqrt{n}/2) \quad \text{[Formula 1]}$$

According to the invention, a phase difference $\Delta\theta$ of exposure light which transmits through a transparent region and a semi-transparent region and a transmittance n of the semi-transparent region with respect to the exposure light satisfy the following formula 2, and the transmittance n is in the range of 0.15 to 0.8.

$$\Delta\theta \leq \arccos(-\sqrt{n}/2) \quad \text{[Formula 2]}$$

According to the invention, an exposure mask including a light-transmitting substrate, a semi-transparent film provided over the light-transmitting substrate, and a light-shielding film provided over the semi-transparent film is provided, and a phase difference $\Delta\theta$ between the semi-transparent film and the light-transmitting substrate with respect to exposure light and a transmittance n of the semi-transparent film with respect to the exposure light satisfy the following formula 3.

$$\Delta\theta \leq \arccos(-\sqrt{n}/2) \quad \text{[Formula 3]}$$

According to the invention, an exposure mask including a light-transmitting substrate, a semi-transparent film provided over the light-transmitting substrate, and a light-shielding film provided over the semi-transparent film is provided, and a phase difference between the semi-transparent film and the light-transmitting substrate with respect to exposure light is in the range of −100° to 100°.

According to the invention, an exposure mask including a light-transmitting substrate, a semi-transparent film provided over the light-transmitting substrate, and a light-shielding film provided over the semi-transparent film is provided, and a phase difference between the semi-transparent film and the light-transmitting substrate with respect to exposure light is in the range of −90° to 90°.

According to the invention, a Cr film or a film formed of a multi-layer of Cr is used as a light-shielding film.

According to the invention, an alloy containing Mo and Si, an alloy containing Cr and Si, or Cr is used as a material for a semi-transparent film.

According to the invention, a transmittance n of a semi-transparent film with respect to the exposure light is in the range of 0.15 to 0.8.

According to the invention, exposure light is i-line (wavelength: 365 nm).

Here, a halftone mask is a photomask formed to have a light-shielding region and a region having a certain transmittance in a photolithography step. The mask has a structure in which an assistant pattern (hereinafter referred to as a halftone film, or merely a semi-transparent film or an assistant pattern) having a function of reducing light intensity and made of a semi-transparent film of which transmittance is in the range of 1 to 99% is provided over a light-transmitting substrate of which rate of transmitting exposure light is approximately 100% (n=1.0), and over the assistant pattern, a light-shielding film is provided. Note that the halftone mask is not limited to the above structure as long as at least three regions of a transparent region, a semi-transparent region, and a light-shielding region are included.

By performing light exposure using the halftone mask of the invention, thickness of a resist film can be adjusted within an exposure region. Accordingly, such a resist that has regions with different thicknesses and an edge having a gentle shape can be formed. By performing a process such as etching by using this resist, regions with different thicknesses can be formed in a self-aligned manner. As a result of this, a transistor, a capacitor, and a resistor having different electrode structures respectively can be formed separately by the same patterning (processing) step, for example. Accordingly, elements having different modes can be manufactured and integrated without increasing the number of manufacturing steps, in accordance with circuit characteristics.

DETAILED DESCRIPTION OF THE INVENTION

Although the invention will be fully described by way of embodiment modes with reference to the accompanying drawings, it is to be understood that various changes and modifications will be apparent to those skilled in the art. Therefore, unless such changes and modifications depart from the scope of the invention, they should be construed as being included therein.

Embodiment Mode 1

Figure 1A:
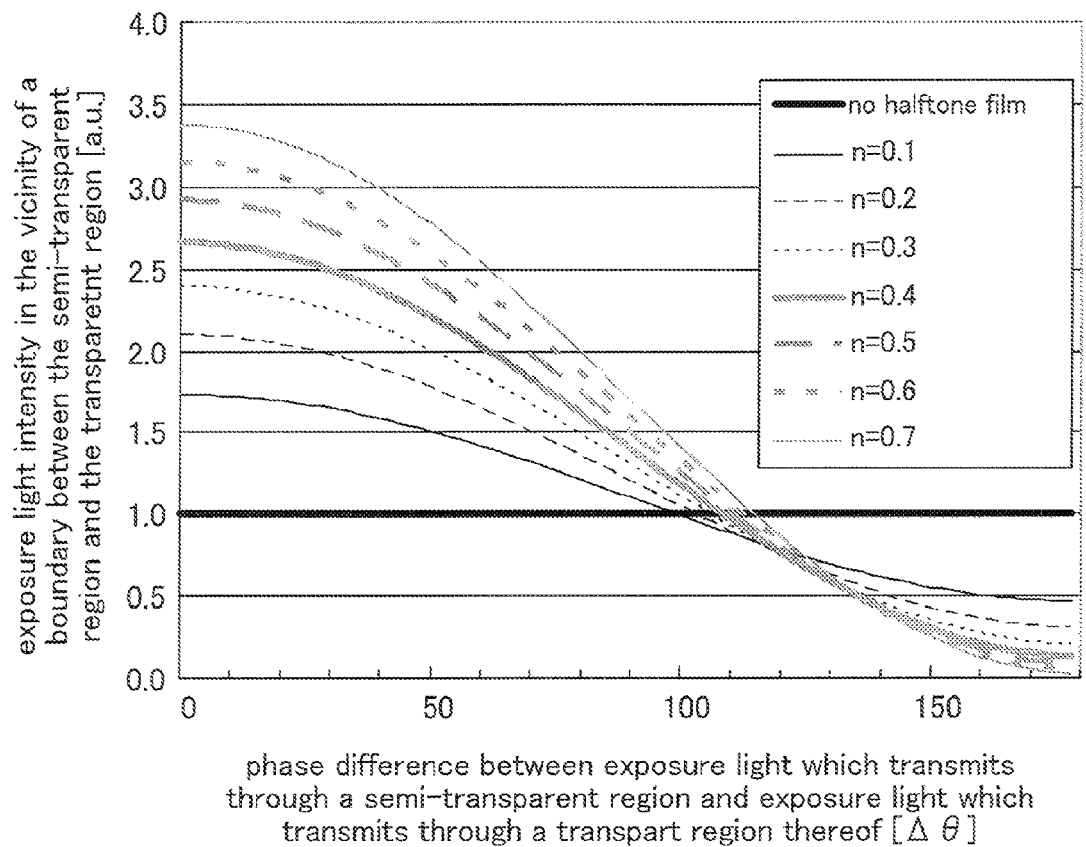
FIG. 1A is a graph showing a relationship between a phase difference Δθ between exposure light which transmits through a semi-transparent region of a halftone mask and exposure light which transmits through a transparent region thereof, and an exposure light intensity over a substrate in the vicinity of a boundary between the semi-transparent region and the transparent region when a transmittance n of a semi-transparent film is changed.
Figure 1B:
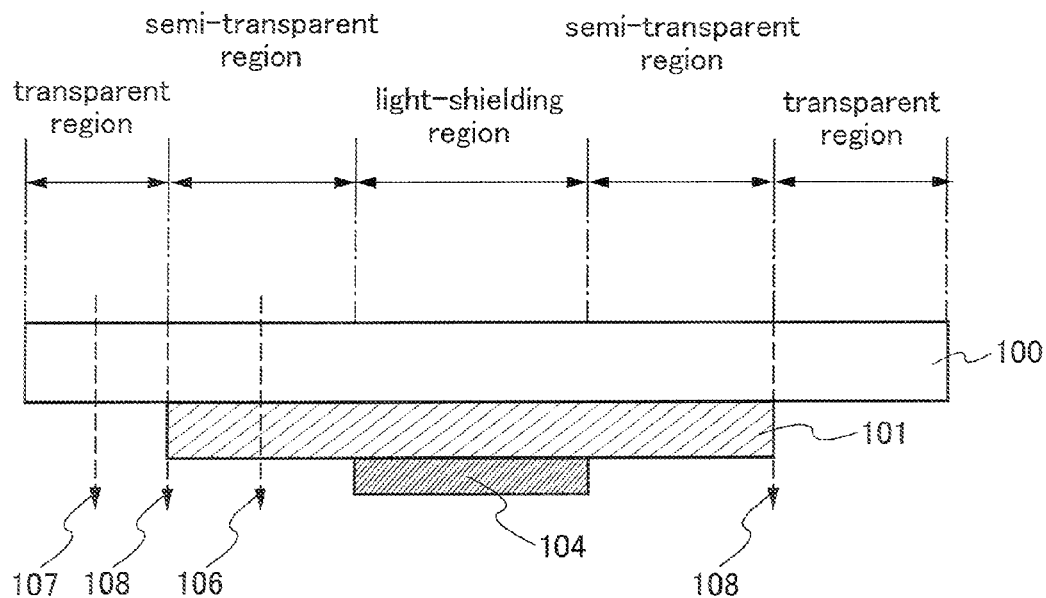
FIG. 1B is a cross-sectional diagram of the halftone mask.

FIG. 1B shows a halftone mask which includes a light-transmitting substrate 100, a semi-transparent film 101, and a light-shielding film 104. FIG. 1A is a graph, as for the halftone mask shown in FIG. 1B, showing a relationship between a phase difference Δθ between exposure light 107 which transmits through a transparent region (here, a region of the light-transmitting substrate 100 where the semi-transparent film 101 does not overlap) and exposure light 106 which transmits through a semi-transparent region (here, a region where only the semi-transparent film 101 and the light-transmitting substrate 100 overlap each other), and an intensity of exposure light 108 which transmits through the vicinity of a boundary between the semi-transparent region and the transparent region when a transmittance n of the semi-transparent film 101 with respect to exposure light is changed. Note that the exposure light which transmits through the vicinity of the boundary can also be said exposure light which transmits through an end surface or an end portion of the semi-transparent film 101. Each curve shown in the graph is expressed by the following approximation formula 4 which has been found out by the inventor.

$$f(\Delta\theta) \approx 1 + n + 2\sqrt{n}\cos\Delta\theta \quad \text{[Formula 4]}$$

Note that Formula 4 above is standardized assuming that exposure intensity without providing the semi-transparent film is 1.

Figure 12:
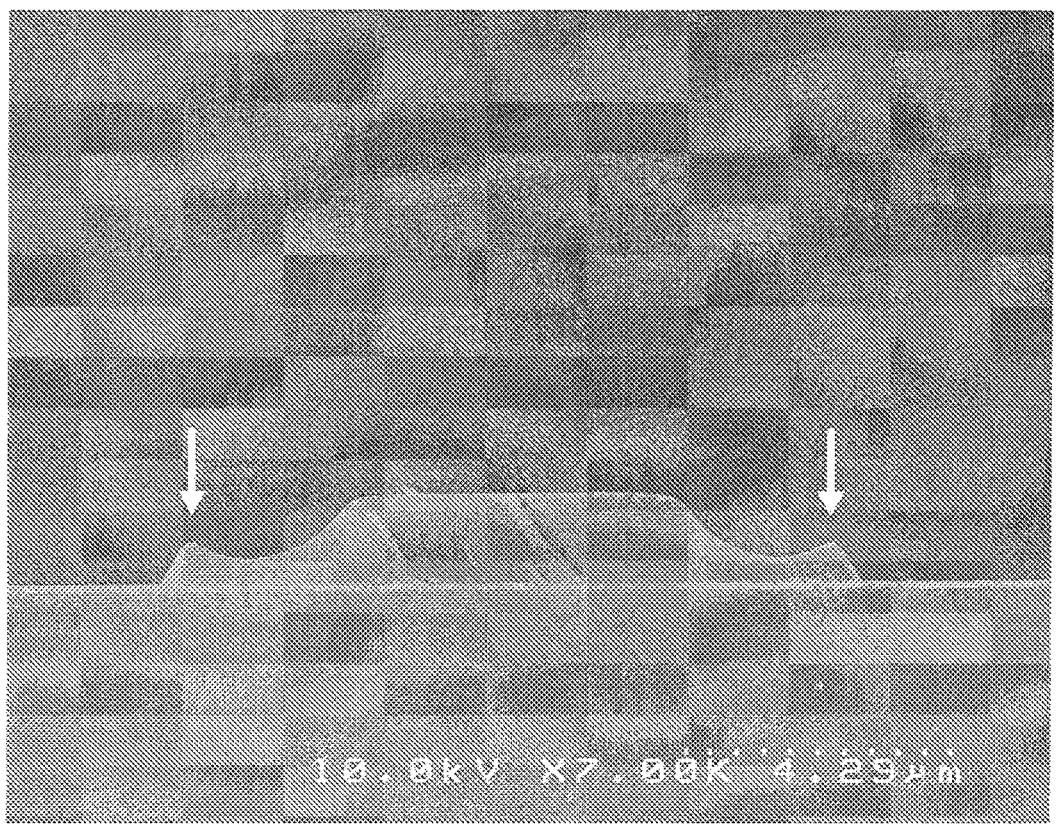
FIG. 12 is a cross-sectional picture of a resist pattern formed using a conventional halftone mask.

For example, in the case where n=0.2 is satisfied, when the phase difference between exposure light which transmits through the transparent region of the halftone mask and exposure light which transmits through the semi-transparent region thereof is 130°, the exposure intensity in the vicinity of the boundary between the transparent region and the semi-transparent region is smaller than 1. As a result, the transmittance of light in the vicinity of the boundary between the transparent film and the semi-transparent film is decreased, so that a convex portion is formed in edges of a resist as shown in FIG. 12.

Next, when the phase difference is about 90° or less, in the case of the transmittance n=0.1 to 0.7, the exposure intensity becomes 1 or more. Therefore, in this case, respective exposure light which transmit through the transparent region and the semi-transparent film of the halftone mask interfere and are strengthened with each other, so that a resist having gentle edges, in which a convex portion is not formed in end portions can be formed. Note that the closer to 1 the transmittance n is, the larger the exposure intensity becomes in the case of the phase difference of 90°. However, when the transmittance n is extremely close to 1, the resist thickness corresponding to the semi-transparent film disappears at the time of development. Thus, the transmittance n of the semi-transparent film is preferably 0.8 or less.

In the case where the exposure light which transmits through the transparent region of the halftone mask and the exposure light which transmits through the semi-transparent region thereof interfere with each other, that is, when the value of f (Δθ) in Formula 4 is 1 or more, a resist in which a convex shape is not formed in an end portion can be formed. When f(Δθ)≦1 is worked out in Formula 4, the following formula 5 can be obtained.

$$\Delta\theta \leqq \arccos(-\sqrt{n}/2) \quad \text{[Formula 5]}$$

Therefore, the phase difference Δθ and the transmittance n preferably satisfy Formula 5. Note that the transmittance n is preferably in the range of 0.1 to 0.8 (preferably 0.15 to 0.8, and more preferably 0.2 to 0.5). In addition, the phase difference Δθ is preferably in the range of −100° to 100° (preferably −90° to 90°, and more preferably 60° to 90°).

Figure 2:
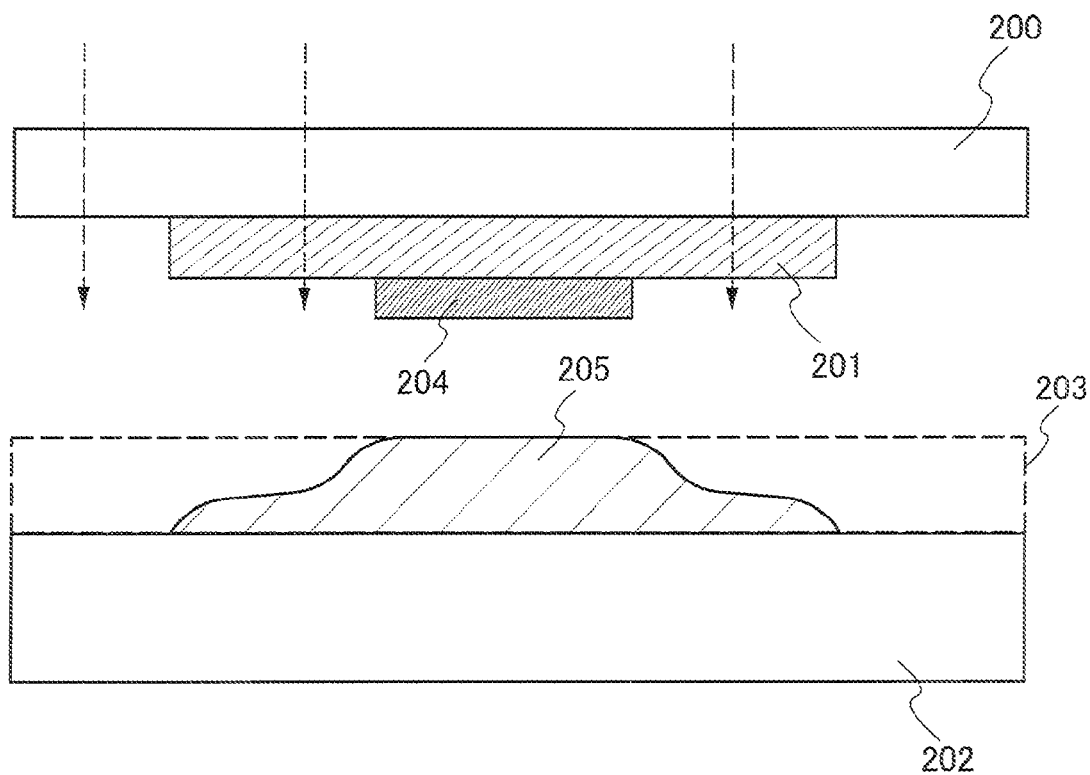
FIG. 2 is a cross-sectional diagram of a half-tone mask and a resist pattern formed using the halftone mask.

FIG. 2 is a schematic diagram of a half-tone mask and a resist pattern formed using the halftone mask of the invention. In an exposure mask, a halftone film 201 made of molybdenum silicide (MoSi) is provided over a light-transmitting substrate 200, and a light-shielding film 204 made of a metal film of chromium (Cr) or the like is stacked over the substrate 200. As for the halftone film 201, it is required that the transmittance (n) with respect to i-line (wavelength: 365 nm) exposure light be 0.15 or more and the phase difference (Δθ) between i-line which transmits through the light-transmitting substrate 200 and i-line which transmits through the light-transmitting substrate 200 and the halftone film 201 be 90° or less. Further, the halftone film 201 can also be formed using a compound of Si and a metal or the like which satisfies the phase difference and the transmittance of Formula 5, e.g., satisfies a condition of n≦0.15 and Δθ≦90°. As the compound of Si and a metal, an alloy or a compound of Si and Mo, such as MoSi, MoSiO, or MoSiON is used. Alternatively, an alloy or a compound of Cr and Si, such as CrSi can be used. Further alternatively, Cr can be used by itself. A flat resist 203 which is formed over a substrate 202 is irradiated with exposure light from above the exposure mask. Then, through a photoresist step, a resist pattern 205 is formed.

Since the light intensity in both end portions of the halftone film is strengthened by interference between the exposure light which transmits through the transparent region and the exposure light which transmits through the semi-transparent region, the resist pattern 205 not having a convex portion in an end portion but having a gentle end portion in a boundary between the transparent region and the semi-transparent region as shown in FIG. 2, can be obtained. In other words, a resist pattern can be formed which has such a shape that, in a first region which is thick formed in a position corresponding to the light-shielding film 204 a second region which is thinner than that of the first region, formed in a position corresponding to the semi-transparent film where the light-shielding film does not overlap, and a third region over a substrate corresponding to the light-transmitting substrate 200 where the light-shielding film 204 and the halftone film 201 do not overlap, the second region is not convex in the vicinity of a boundary between the second region and the third region. By using this resist pattern 205, gate electrodes having different shapes can be formed in a self-aligned manner over the same substrate and the width of an LDD region, or the like can be controlled in accordance with each structure.

Here, being semi-transparent means that the transmittance of a semi-transparent film is in the range of 1 to 99% where the rate of transmitting exposure light through a transparent region is assumed to be 100%. Note that the optimal transmittance of the semi-transparent film is in the range of 15 to 80% according to the inventor's experience.

Therefore, in the halftone mask, the phase difference of i-line which transmits through the transparent region and the semi-transparent region is preferably 100° or less (preferably 90° or less), and the transmittance n is preferably in the range of 0.15 to 0.8.

Note that as a method for precisely controlling the phase difference of exposure light which transmits through the transparent region and the semi-transparent region, the light-transmitting substrate may be removed with a predetermined depth by performing a process such as etching.

In addition, in FIG. 2, the light-shielding film 204 may be omitted as long as a resist having a similar shape can be formed by adjusting thickness of the halftone film 201 or disposing interval thereof.

In this embodiment mode, for the photomask or reticle for forming a gate electrode, a pattern structure for a positive-type resist is used. Positive-type resist is a resist in which a region irradiated with exposure light can be dissolved in developer. If possible, a negative-type resist may also be used. Negative-type resist is a resist in which a region irradiated with exposure light cannot be dissolved in developer.

Next, steps for forming a gate electrode of a TFT by using the halftone mask of the invention will be described with reference to FIGS. 3A to 3D.

First, a first insulating film 302 as a base film is formed over a substrate 301 having an insulating surface. As for the substrate 301 having an insulating surface, a light-transmitting substrate such as a glass substrate, a crystalline glass substrate, or a plastic substrate can be used. In addition, in the case where a thin film transistor to be formed later is used in a light-emitting display device of a top emission type or a liquid crystal display device of a reflective type, a ceramic-ubstrate, a semiconductor substrate, a metal substrate, or the like can also be used. As the semiconductor substrate, a silicon substrate such as an n-type or a p-type single crystalline silicon substrate or a high-purity silicon substrate can be used. For example, in the case of using an n-type substrate, a p-well into which an p-type impurity is injected may be formed so that a MOS transistor using a top layer of this well as a semiconductor layer may be formed instead of a TFT.

As the first insulating film 302, a single layer or a multi-layer of an insulating film such as a silicon oxide film, a silicon nitride film, or a silicon oxynitride film ($SiO_xN_y$) is used. Subsequently, a semiconductor layer 303 is formed over the first insulating film 302.

The semiconductor layer 303 is formed as follows: a semiconductor film having an amorphous structure is formed by a known method (e.g., sputtering, LPCVD, or plasma CVD) and crystallized by heat treatment to form a crystallized crystalline semiconductor film; a resist film is formed on the crystalline semiconductor film and then light exposure and development are performed to obtain a first resist mask; and the crystalline semiconductor film is processed into a desired shape by using the first resist mask.

This semiconductor layer 303 is formed to have a thickness of 25 to 80 nm (preferably 30 to 70 nm). The material of the crystalline semiconductor film is not limited; however, the crystalline semiconductor film is preferably formed of silicon, a silicon-germanium (SiGe) alloy, or the like.

For the heat treatment described above, a heating furnace, laser irradiation, irradiation with light that is emitted from a lamp (hereinafter referred to as lamp annealing) instead of laser light, or a combination thereof can be used.

Alternatively, a crystalline semiconductor film may be formed by thermal crystallization in which the heat treatment described above is performed after a catalyst such as nickel is added. It is to be noted that when such crystallization is performed by thermal crystallization using a catalyst such as nickel to obtain a crystalline semiconductor film, it is preferable to perform gettering treatment of removing the catalyst such as nickel after the crystallization.

Further, in the case where a crystalline semiconductor film is formed by laser crystallization, a continuous wave laser beam (a CW laser beam) or a pulsed wave laser beam (a pulsed laser beam) can be used. As a laser beam that can be used here, a laser beam emitted from one or more kinds of gas lasers such as an Ar laser, a Kr laser, and an excimer laser; a laser using, as a medium, a single crystal of YAG, YVO$_4$, forsterite (Mg$_2$SiO$_4$), YAlO$_3$, or GdVO$_4$ or a polycrystal (ceramic) of YAG, Y$_2$O$_3$, YVO$_4$, YAlO$_3$, or GdVO$_4$ doped with one or more kinds of Nd, Yb, Cr, Ti, Ho, Er, Tm, and Ta as a dopant; a glass laser; a ruby laser; an alexandrite laser; a Ti:sapphire laser; a copper vapor laser; and a gold vapor laser can be used. Irradiation with the fundamental waves of these laser beams or the second to fourth harmonic of these fundamental waves allows crystals having large grain size to be obtained. For example, the second harmonic (532 nm) or the third harmonic (355 nm) of a Nd:YVO$_4$ laser (fundamental wave: 1064 nm) can be used. The energy density of the laser in this case needs to be about 0.01 to 100 MW/cm$^2$ (preferably 0.1 to 10 MW/cm$^2$). Then, the irradiation is performed at a scanning rate of about 10 to 2000 cm/sec.

Note that, as for the laser using, as a medium, a single crystal of YAG, YVO$_4$, forsterite (Mg$_2$SiO$_4$), YAlO$_3$, or GdVO$_4$ or a polycrystal (ceramic) of YAG, Y$_2$O$_3$, YVO$_4$, YAlO$_3$, or GdVO$_4$ doped with one or more kinds of Nd, Yb, Cr, Ti, Ho, Er, Tm, and Ta as a dopant; the Ar ion laser; or the Ti:sapphire laser, continuous wave oscillation is possible, and besides, pulsed oscillation at an oscillation frequency of 10 MHz or more is also possible by performing Q-switch operation, mode locking, or the like. When pulsed oscillation at an oscillation frequency of 10 MHz or more is performed, the semiconductor film is irradiated with a next pulse until the semiconductor film is solidified after being melted by laser. Accordingly, unlike the case of using a pulsed laser at a lower repetition rate, the solid-liquid interface in the semiconductor film can be continuously moved, thus crystal grains grown continuously in the scanning direction can be thus obtained.

When ceramic (polycrystal) is used as the medium, the medium can be formed in any shape at low cost in short time. While a columnar medium of several mm in diameter and several tens mm in length is generally used when a single crystal is used, larger mediums in size can be formed when ceramic is used.

Since the concentration of the dopant such as Nd and Yb which directly contributes to light emission in the medium is not able to be significantly changed regardless of whether a single crystal or a polycrystal, improvement in laser power by increasing the concentration is limited to some extent. However, in the case of ceramic, drastic improvement in power can be expected since the size of the medium can be significantly increased as compared with a single crystal.

Further, in the case of ceramic, a medium in the shape of a parallel six-hedron shape or a cuboid shape can be easily formed. When a medium in this shape is used to make emitted light travel in zigzags within the medium, the emitted light path can be made longer. Therefore, the amplification is increased to enable oscillation with large power. In addition, a laser beam that is emitted from a medium with this shape has a cross section of a quadrangular shape when the beam is emitted, and is therefore advantageous in shaping into a linear beam as compared with a circular shape. Shaping thus emitted laser beam with the use of an optical system makes it possible to easily obtain a linear laser beam that has a shorter side of 1 mm or less in length and a longer side of several mm to several m in length. In addition, irradiating the medium uniformly with excitation light makes the linear beam have a uniform energy distribution in the longer side direction.

Irradiation of the semiconductor film with this linear beam allows more uniform annealing of the entire surface of the semiconductor film. In the case where uniform annealing is required up to both ends of the linear beam, such a technique as arranging slits at both the ends for shielding light in an energy attenuating portion is required.

By using thus obtained uniform intensity linear beam to anneal the semiconductor film and manufacturing an electronic device by using this semiconductor film, the electronic device has favorable and uniform characteristics.

Then, if necessary, doping with a slight amount of impurity element (boron or phosphorous) is performed to the semiconductor layer in order to control the threshold voltage of a TFT; here, ion doping in which diborane (B$_2$H$_6$) is not mass-separated but plasma-excited is used.

Subsequently, after removing the first resist mask, an oxide film is removed with an etchant containing hydrofluoric acid and at the same time, the surface of the semiconductor layer is cleaned with the etchant. Then, a second insulating film 304 which is a gate insulating film covering the semiconductor layer is formed. The second insulating film 304 is formed by plasma CVD, sputtering, or thermal oxidation to have a thickness of 1 to 200 nm, preferably 70 to 120 nm. As the second insulating film 304, a film composed of an insulating film such as a silicon oxide film, a silicon nitride film, or a silicon oxynitride film is formed; here, a silicon oxynitride film (composition ratio: Si=32%, O=59%, N=7%, and H=2%) is formed by plasma CVD to have a thickness of 115 nm.

After forming the insulating layer as the base film, the semiconductor layer, the gate insulating layer, the interlayer insulating layer, or the like over the substrate, oxidation or nitridation may be performed by plasma treatment so as to oxidize or nitride the surface of the substrate, the insulating layer as the base film, the semiconductor layer, the gate insulating layer, the interlayer insulating layer, or the like. When the semiconductor layer or the insulating layer is oxidized or nitrided by plasma treatment, the surface thereof can be reformed to be an insulating film that has higher density than an insulating film formed by CVD or sputtering. Therefore, defects such as pinholes can be suppressed and the semiconductor device can exhibit improved characteristics. The aforementioned plasma treatment may also be applied to a gate electrode layer, a source electrode layer, a drain electrode layer, a wiring layer, or the like, so that a nitride film or an oxide film can be formed by nitridation or oxidation.

Note that in the case where the film is oxidized by plasma treatment, the plasma treatment is performed in an oxygen atmosphere (e.g., an atmosphere including oxygen (O$_2$) and a rare gas (containing at least one of He, Ne, Ar, Kr, and Xe); an atmosphere including oxygen, hydrogen (H$_2$), and a rare gas; or an atmosphere including dinitrogen monoxide and a rare gas). On the other hand, in the case where the film is nitrided by plasma treatment, the plasma treatment is performed in a nitrogen atmosphere (e.g., an atmosphere including nitrogen (N$_2$) and a rare gas (containing at least one of He, Ne, Ar, Kr, and Xe); an atmosphere including nitrogen, hydrogen, and a rare gas; or an atmosphere including NH$_3$ and a rare gas). As the rare gas, Ar can be used for example. Alternatively, a mixed gas of Ar and Kr may be used. Thus, the insulating film formed by such plasma treatment includes the rare gas (containing at least one of He, Ne, Ar, Kr, and Xe) used for the plasma treatment, and in the case where Ar is used, Ar is contained in the insulating film.

In addition, in the case where such plasma treatment is performed to the second insulating film 304, the plasma treatment is performed at an electron density of $1\times10^{11}$ cm$^{-3}$ or more and an electron temperature of plasma of 1.5 eV or less in the atmosphere containing the gas described above. More specifically, the electron density is in the range of $1\times10^{11}$ to $1\times10^{13}$ cm$^{-3}$, and the electron temperature of plasma is in the range of 0.5 to 1.5 eV. The electron density of plasma is high and the electron temperature around an object to be treated (here, the second insulating film 304 functioning as a gate insulating layer) formed over the substrate is low; therefore, the object to be treated can be prevented from being damaged due to plasma. In addition, because of the plasma electron density as high as $1\times10^{11}$ cm$^{-3}$ or more, the oxide film or the nitride film formed by oxidizing or nitriding the object to be treated by the plasma treatment can be superior in uniformity of film thickness as compared with a film formed by CVD, sputtering, or the like, and dense. In addition, since the electron temperature of plasma is as low as 1.5 eV or less, the oxidation or nitridation treatment can be performed at a lower temperature than conventional plasma treatment or thermal oxidation method. For example, the oxidation or nitridation treatment can be performed sufficiently even when the plasma treatment is performed at a temperature lower by at least 100° C. than a strain point of a glass substrate. As the frequency for producing plasma, high frequency waves such as microwaves (2.45 GHz) can be employed. Note that in this specification, plasma treatment is performed in the aforementioned conditions, unless otherwise noted.

Next, a stacked layer of a first conductive layer 305a and a second conductive layer 306a is formed. The stacked layer is not limited to two layers of the first conductive layer and the second conductive layer, and a stacked layer of three layers or more may also be used.

The first conductive layer is formed of a refractory metal such as tungsten (W), chromium (Cr), tantalum (Ta), tantalum nitride (TaN), or molybdenum (Mo), or an alloy or a compound containing the refractory metal as a main component to have a thickness of 20 to 50 nm. In addition, the second conductive layer is formed of a refractory metal such as tungsten (W), chromium (Cr), tantalum (Ta), tantalum nitride (TaN), or molybdenum (Mo), or an alloy or a compound containing the refractory metal as a main component to have a thickness of 300 to 600 nm.

Here, the two layers, namely the first conductive layer and the second conductive layer are formed using different conductive materials respectively, so that difference in etching rate is generated in an etching step that is performed later. TaN is used for the first conductive layer, and a tungsten film is used as the second conductive layer.

Subsequently, after a resist film is applied entirely on the second conductive layer 306a, light exposure is performed using a mask shown in FIG. 3A. Here, a resist film having a thickness of 1.5 μm is applied, and a light exposure machine of which resolution is 1.5 μm is used for the light exposure. Light used for the light exposure is i-line (wavelength: 365 nm), and the exposure energy is selected from a range of 20 to 140 mJ/cm$^2$. In addition, the light is not limited to i-line, and light in which i-line, g-line (wavelength: 436 nm) and h-line (wavelength: 405 nm) are mixed may also be used for the light exposure.

Figure 3A:
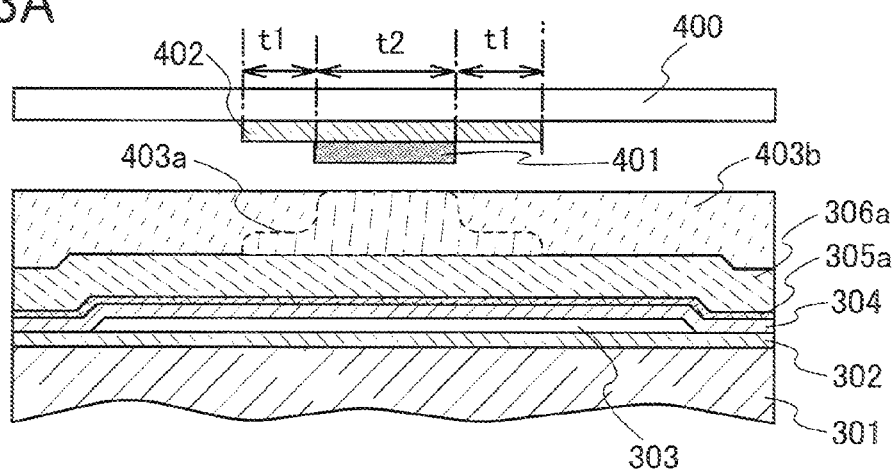
FIGS. 3A to 3D are cross-sectional diagrams for showing manufacturing steps of a semiconductor device.

In FIG. 3A, as for the exposure mask, a light-shielding portion 401 formed of a metal film such as Cr, and a portion provided with a semi-transparent film 402 (also called a semi-transparent portion or a halftone film) as an assistant pattern having a function of reducing light intensity are provided. As the semi-transparent film 402, a semi-transparent film of which thickness, material, composition, or the like are controlled such that the transmittance (n) with respect to i-line is 0.2, and the phase difference between exposure light which transmits through a light-transmitting substrate 400 and exposure light which transmits through the light-transmitting substrate 400 and the semi-transparent film 402 is 90°. In the cross-sectional diagram of the exposure mask, width of the light-shielding portion 401 is denoted by t2, and width of the portion provided with the semi-transparent film 402 is denoted by t1.

When light exposure is performed to the resist film by using the exposure mask shown in FIG. 3A, a non-exposed region 403a and an exposed region 403b are formed. In the light exposure, the non-exposed region 403a shown in FIG. 3A is formed by light that is conducted around the light-shielding portion 401 or transmitted through the portion provided with the semi-transparent film 402.

Figure 3B:
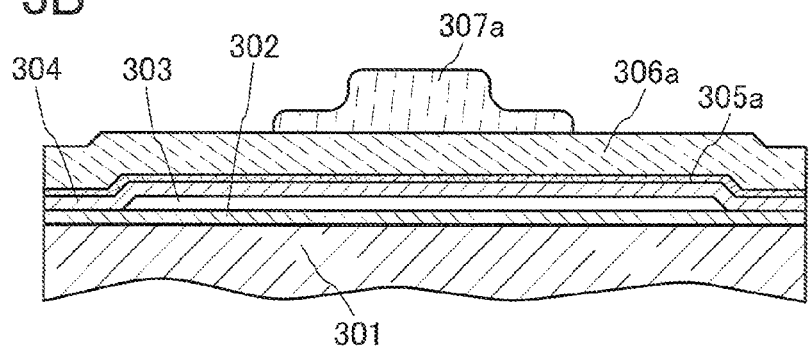

Then by performing development, the exposed region 403b is removed, and as shown in FIG. 3B, a resist pattern 307a having a region with large thickness and a region with a thickness smaller than that of the above region can be obtained over the second conductive layer 306a. In the resist pattern 307a, resist thickness of the region with small thickness can be controlled by controlling the exposure energy.

Then, etching of the second conductive layer 306a and the first conductive layer 305a is performed by dry etching. As the etching gas, at least one of CF$_4$, SF$_6$, Cl$_2$, and O$_2$ is used. A dry etching apparatus using a high-density plasma source such as ECR (Electron Cyclotron Resonance) or ICP (Inductively Coupled Plasma) is used to improve etching rate. It is to be noted that the second insulating film 304 may also be etched and thickness becomes partially small, depending on the etching condition.

Note that the case of using an ICP etching apparatus is described here; however, the invention is not particularly limited, and for example, a parallel-plate etching apparatus, a magnetron etching apparatus, an ECR etching apparatus, or a helicon-type etching apparatus may also be employed. In addition, the invention is not limited to dry etching, and wet etching may also be employed. Further, combination of dry etching and wet etching may also be employed.

Figure 3C:
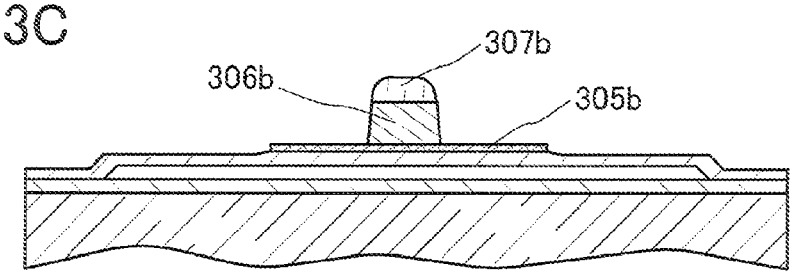

In such a manner, as shown in FIG. 3C, a pattern of a conductive stacked layer composed of the first conductive layer 305b and the second conductive layer 306b is formed over the second insulating film 304. By etching, both side-walls of the first conductive layer 305b are exposed, and besides, a region of the same where the second conductive layer 306b does not overlap is exposed. Note that both the side-walls of the first conductive layer 305b may have a taper shape. In addition, both side-walls of the second conductive layer 306b may also have a taper shape.

Next, after a resist pattern 307b is removed, an impurity having one conductivity type is added to the semiconductor layer 303. Here, phosphorus (or As) is used as an ion of the impurity having one conductivity type, to form an n-channel TFT. By using the pattern of the conductive stacked layer, an LDD region (GOLD region), a source region and a drain region can be formed in a self-aligned manner without forming a sidewall.

In the case where doping treatment for forming a source region and a drain region provided outside a gate electrode is performed, ions of an impurity having one conductivity type may be added to the semiconductor layer 303 by using the pattern of the conductive stacked layer as a mask, to form high-concentration impurity regions 310 and 311 having one conductivity type. As the doping condition for forming the source region and the drain region, the accelerating voltage is set to be 50 kV or less. Impurity concentration of the high-concentration impurity regions 310 and 311 having one conductivity type is set to be $1\times10^{19}$ to $5\times10^{21}/cm^3$ (the peak value by SIMS measurement).

In addition, in the case where doping treatment for forming an LDD region (GOLD region) overlapped with a gate electrode is performed, ions of an impurity having one conductivity type may be added to the semiconductor layer 303 through the first conductive layer 305b in a region where the second conductive layer is not stacked, to form low-concentration impurity regions 309a and 309b having one conductivity type. As the doping condition in this case, though depending on thickness of the second conductive layer or the first conductive layer, an accelerating voltage of 50 kV or more is required. Impurity concentration of the low-concentration impurity regions 309a and 309b having one conductivity type is set to be $1\times10^{17}$ to $5\times10^{19}/cm^3$ (the peak value by SIMS measurement), provided that it is an LDD region.

It is to be noted that the order of doping is not particularly limited; after performing doping treatment for forming a source region and a drain region, doping treatment for forming an LDD region (GOLD region) may be performed, or alternatively, after performing doping treatment for forming an LDD region (GOLD region), doping treatment for forming a source region and a drain region may be performed.

In addition, although the case where doping treatment is performed twice separately to form impurity regions having different concentrations is described here, impurity regions having different concentrations may also be formed by one doping treatment by adjusting the treatment condition.

In addition, although the case where a resist pattern is removed before doping is described here, a resist pattern may also be removed after doping treatment. When doping is performed with a resist pattern left, doping can be performed while protecting the surface of the second conductive layer with the resist pattern.

Note that, in the case of the doping treatment, the semiconductor layer in a position where the second conductive layer overlaps is a region to which the ions of the impurity having one conductivity type are not added and functions as a channel formation region of a TFT that is formed later.

In addition, the pattern of the conductive stacked layer (the first conductive layer 305b and the second conductive layer 306b) in a portion intersected with the semiconductor layer 303 becomes a gate electrode. Further, a region of the first conductive layer 305b, where the second conductive layer 306b does not overlap, is the length of a Lov region. Note that a Lov region means a low-concentration impurity region (LDD region) where a gate electrode overlaps. The necessary length of the Lov region may be determined in accordance with a type or a use application of a circuit including the TFT, and the exposure mask or etching condition may be set based on the length. Note that "ov" means "overlap".

After that, a third insulating film 312 using silicon nitride oxide is formed. Then, activation and hydrogenation of the impurity elements added to the semiconductor layer are performed.

Subsequently, a fourth insulating film 313 is formed using a light transmitting inorganic material (e.g., silicon oxide, silicon nitride, or silicon oxynitride) or an organic compound material having a low dielectric constant (a photosensitive or non-photosensitive organic resin material, e.g., polyimide or polybenzoxazole). Alternatively, the fourth insulating film may be formed using a material containing siloxane. Note that siloxane is a material including a skeleton structure formed by a bond of silicon (Si) and oxygen (O). As a substituent, an organic group containing at least hydrogen (e.g., an alkyl group or aromatic hydrocarbon) is used. A fluoro group may also be used as the substituent. Alternatively, as the substituents, both of an organic group containing at least hydrogen and a fluoro group may be used.

Then, a mask made of resist is formed using a third photomask, and the third insulating film 312 functioning as an interlayer insulating film, the fourth insulating film 313, and the second insulating film 304 functioning as a gate insulating film are selectively etched to form a contact hole. After that, the mask made of resist is removed.

After a metal stacked layer film is formed over the fourth insulating film 313 by sputtering, a mask made of resist is formed using a fourth photomask, and the metal stacked layer film is selectively etched to form a source electrode 314 and a drain electrode 315 which are in contact with the semiconductor layer.

It is to be noted that a connection electrode (an electrode for electrically connecting plural TFTs) or a terminal electrode (an electrode for connecting to an external power supply) can also be formed at the same time as the source electrode 314 and the drain electrode 315 of a TFT over the fourth insulating film 313. Then, the mask made of resist is removed. Note that the metal stacked layer film has a stacked layer of three layers of a Ti film with a thickness of 100 nm, an Al film containing a small amount of Si with a thickness of 350 nm, and a Ti film with a thickness of 100 nm. The metal stacked layer film is preferably formed continuously in the same metal sputtering apparatus.

Figure 3D:
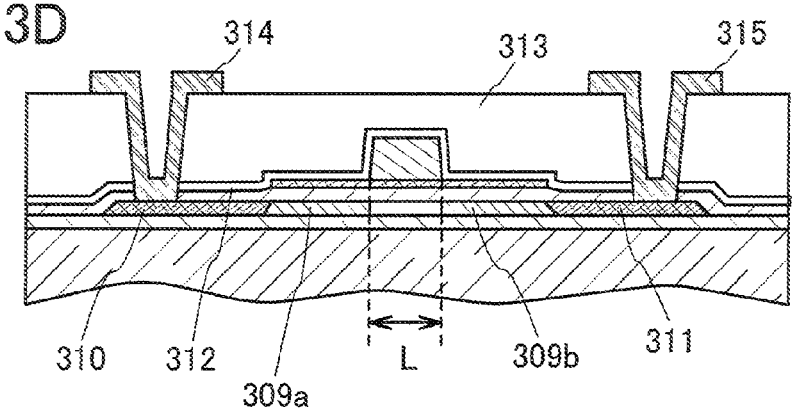

Through the above-described steps, a top-gate TFT having the low-concentration impurity regions 309a and 309b having one conductivity type on both sides of the channel formation region is formed as shown in FIG. 3D. In FIG. 3D also, a channel length L is shown.

As described above, in this embodiment mode, light exposure is performed using the photomask of which transmittance of the halftone mask with respect to exposure light and the phase difference are controlled, so that the resist pattern 307a having a gentle shape in an end portion is formed and the gate electrode is obtained using this resist pattern. By adjusting length of the portion with small thickness of the resist pattern 307a, length of the Lov region can be adjusted in a self-aligned manner.

Note that the description is made using an n-channel TFT in this embodiment mode; however, a p-channel TFT can also be formed by using a p-type impurity element instead of an n-type impurity element.

Further, an n-channel TFT and a p-channel TFT can also be formed over the same substrate, and by combining these TFTs complementarily, a CMOS circuit can be formed. The CMOS circuit indicates a circuit having at least one n-channel TFT and one p-channel TFT (e.g., an inverter circuit, a NAND circuit, an AND circuit, a NOR circuit, an OR circuit, a shift register circuit, a sampling circuit, a D/A converter circuit, an A/D converter circuit, a latch circuit, or a buffer circuit). In addition, by combining the CMOS circuits, a memory element such as an SRAM or a DRAM or another element can be formed over the substrate. Further, a CPU can also be formed over the substrate by integrating various elements or circuits.

In addition, the description is made using a top gate TFT with a single gate structure in this embodiment mode; however, a top gate TFT with a multi gate structure having a plurality of channel formation regions can also be formed. In addition, a top gate TFT with a single gate structure and a top gate TFT with a multi gate structure can also be formed over the same substrate only by changing an exposure mask, without increasing the number of manufacturing steps. Note that a single gate structure is such a structure that one TFT has one gate electrode. A multi gate structure is such a structure that a plurality of gate electrodes are provided, in which two or more TFTs are connected in series and respective gate electrodes of the TFTs are connected.

Accordingly, only by changing an exposure mask, without increasing the number of manufacturing steps, various circuits can be formed over the same substrate by allocating transistors with appropriate structures.

Embodiment Mode 2

In this embodiment mode, the following case will be described with reference to FIGS. 4A to 4C; by using the exposure mask satisfying a condition of the invention, without increasing the number of manufacturing steps, a top gate TFT with a structure in which a Lov region on a drain side is wider than that on a source side, and a top gate TFT with a structure in which Lov regions on both sides of a channel formation region respectively have the same width are formed over the same substrate.

Figure 4A:
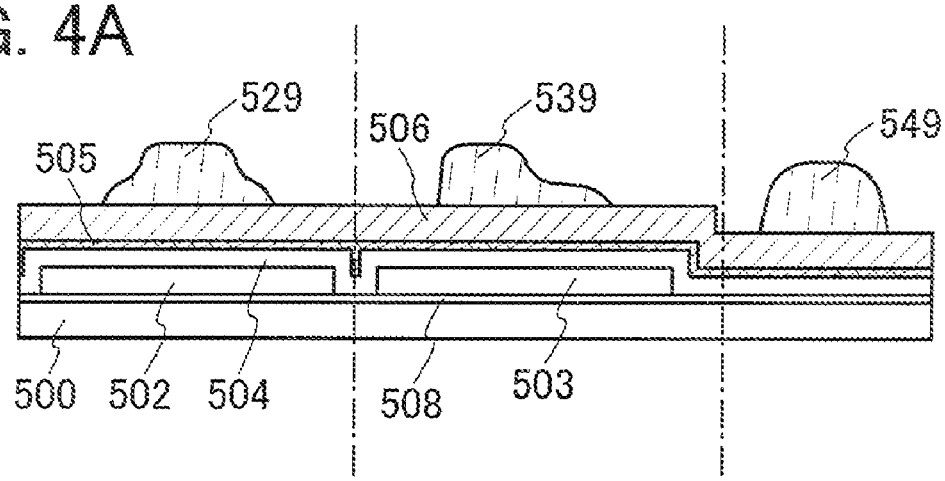
FIGS. 4A to 4C are cross-sectional diagrams for showing manufacturing steps of a semiconductor device.

In FIG. 4A, over a substrate 500 and an insulating layer 508, a semiconductor layer 502 and a semiconductor layer 503 are formed. So as to cover the semiconductor layer 502 and the semiconductor layer 503, a gate insulating layer 504, a first conductive film 505, and a second conductive film 506 are formed, and a resist pattern 529, a resist pattern 539, and a resist pattern 549 are formed to be different shapes respectively as shown in FIG. 4A. These resist patterns are, as described in Embodiment Mode 1, formed by using an exposure mask which is composed of a halftone mask and a light-transmitting substrate and of which phase difference between exposure light which transmits through the halftone mask and the light-transmitting substrate and exposure light which transmits through the halftone mask and of which transmittance of the halftone mask satisfy Formula 5. Therefore, a convex portion is not formed in respective end portions of the resist patterns, and the end portions of the resist patterns have gentle shape.

The resist pattern 529 has such a shape that has gentle steps on both sides respectively (a symmetrical shape in the cross-section of FIG. 4A), the resist pattern 539 has such a shape that has a convex portion in a position disposed off-center (an asymmetrical shape in the cross-section of FIG. 4A), and the resist pattern 549 has such a shape that has neither a step nor a convex or concave portion (a symmetrical shape in the cross-section of FIG. 4A).

Patterning is performed using the resist patterns 529, 539, and 549 by etching process, thereby forming a first gate electrode layer 521, a second gate electrode layer 522, a first gate electrode layer 531, a second gate electrode layer 532, a first wiring layer 541, and a second wiring layer 542.

Figure 4B:
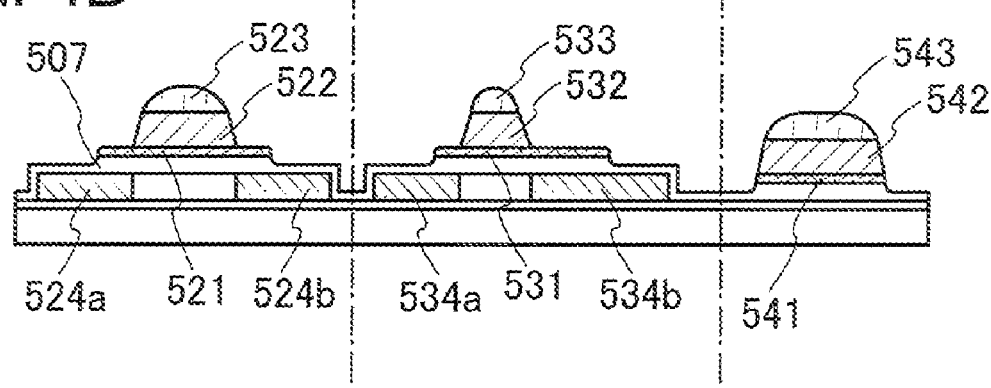
Figure 4C:
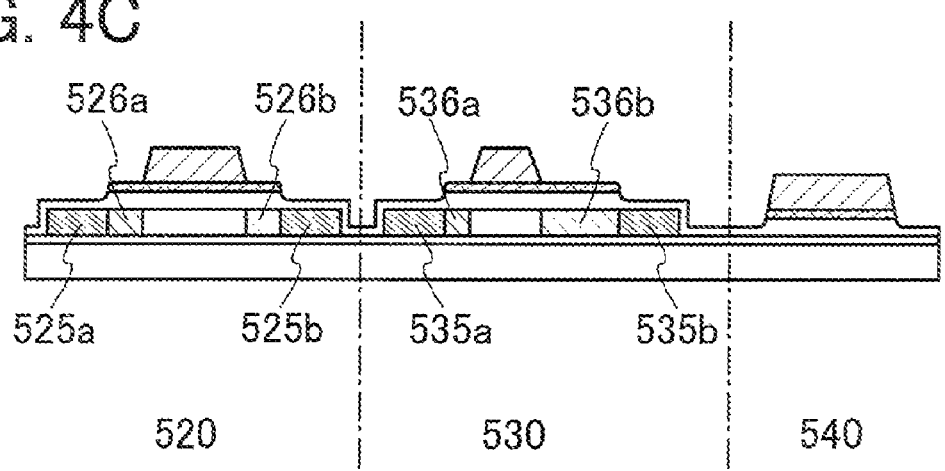

An impurity element having one conductivity type is added to the semiconductor layers 502 and 503 with the second gate electrode layers 522 and 532 used as masks, thereby forming low-concentration impurity regions 524a, 524b, 534a, and 534b (see FIG. 4B).

Further, an impurity element having one conductivity type is added to the semiconductor layers 502 and 503 with the first gate electrode layer 521, the second gate electrode layer 522, the first gate electrode layer 531, and the second gate electrode layer 532 used as masks, thereby forming high concentration impurity regions 525a, 525b, 535a, and 535b.

Then, a resist pattern 523, a resist pattern 533, and a resist pattern 543 are removed.

In this manner, a first TFT portion 530, a second TFT portion 520, and a wiring portion 540 can be formed over the same substrate. In the first TFT portion 530, a TFT having a low-concentration impurity region 536a on the source side and a low-concentration impurity region 536b on the drain side is formed; the low-concentration impurity region 536b is wider than the low-concentration impurity region 536a. In the second TFT portion 520, a TFT having low-concentration impurity regions 526a and 526b respectively on both sides of the channel formation region is formed. (see FIG. 4C) In addition, a stacked layer in which end portions are in alignment, that is, a stacked layer of the first wiring layer 541 and the second wiring layer 542 is obtained in the wiring portion 540.

In addition, by using the same resist pattern, the same structure as that of the first TFT portion 530 can be formed so that a capacitor and a TFT can be formed over the same substrate. In that case, a capacitor including the gate insulating layer 504 as a dielectric can also be formed.

Embodiment Mode 3

In this embodiment mode, a structure of an active matrix light-emitting device will be described with reference to FIGS. 5 and 6 along with a manufacturing method thereof.

First, over a substrate 610 having an insulating surface, a base insulating film 611 is formed. In the case where light-emission is extracted with the substrate 610 side as a display surface, a glass substrate or a quartz substrate having a light-transmitting property may be used as the substrate 610. Further, a light-transmitting plastic substrate having a heat resistant property which can resist processing temperature may also be used. On the other hand, in the case where light-emission is extracted with an opposite surface to the substrate 610 side as a display surface, a silicon substrate, a metal substrate, or a stainless steel substrate over which an insulating film is formed may also be used as well as the above substrates; here, a glass substrate is used as the substrate 610. Note that the refractive index of a glass substrate is around 1.55.

As the base insulating film 611, a base film composed of an insulating film such as a silicon oxide film, a silicon nitride film, or a silicon oxynitride film is formed. Described here is the case where a single layer structure is employed for the base film; however, a structure of stacking two or more of the insulating layers may also be employed. Note that the base insulating film is not required to be formed when concavity and convexity of the substrate and impurity diffusion from the substrate are concerned a non-issue.

Subsequently, a semiconductor layer is formed over the base insulating film 611. The semiconductor layer is formed as follows: a semiconductor film having an amorphous structure is formed by a known method (e.g., sputtering, LPCVD, or plasma CVD) and crystallized by a known crystallization treatment (e.g., laser crystallization, thermal crystallization, or thermal crystallization using a catalyst such as nickel) to form a crystalline semiconductor film, and the crystalline semiconductor film is processed into a desired shape (patterning) by using a first photomask. It is to be noted that, by using plasma CVD, the base insulating film and the semiconductor film having an amorphous structure can be stacked continuously without being exposed to atmospheric air. The semiconductor film is formed to have a thickness of 25 to 80 nm (preferably 30 to 70 nm). Material of the crystalline semiconductor film is not particularly limited, and preferably, silicon or silicon-germanium (SiGe) alloy is used.

Here, as the technique for crystallizing the semiconductor film having an amorphous structure, a technique disclosed in Japanese Patent Laid-Open No. 8-78329 is used. According to the technique disclosed in this publication, a metal element which promotes crystallization is selectively added to an amorphous silicon film, and heat treatment is performed thereto, thereby forming a semiconductor film having a crystal structure expanding from the added region.

One example of the forming method of the crystalline semiconductor film will be described in detail below.

First, a nickel acetate solution containing a metal element having catalysis for promoting crystallization (nickel here) of 1 to 100 ppm in weight is coated using a spinner over the surface of the semiconductor film having an amorphous structure, thereby forming a nickel-containing layer. As a method other than the method for forming the nickel-containing layer by coating, a method for forming an extremely thin film by sputtering, evaporation, or plasma treatment may also be employed. In addition, although the example of coating the entire surface is described here, the nickel-containing layer may also be selectively formed by using a mask.

Then, heat treatment is performed for crystallization. In this case, silicide is formed in a portion of the semiconductor film that is in contact with the metal element for promoting crystallization of the semiconductor, and crystallization is progressed by using the silicide as a nucleus. In this manner, a semiconductor film having a crystal structure is obtained. It is to be noted that the concentration of oxygen contained in the semiconductor film after the crystallization is desirably $5 \times 10^{18}$ atoms/cm$^3$ or less. Here, after performing heat treatment for dehydrogenation (500° C. for 1 hour), heat treatment for crystallization (550 to 650° C. for 4 to 24 hours) is performed. In addition, in the case of performing the crystallization by using intense light irradiation, any one of infrared light, visible light and ultraviolet light, or combination thereof can be used. Note that, if necessary, heat treatment for discharging hydrogen contained in the semiconductor film having an amorphous structure may be performed before the intense light irradiation. Alternatively, heat treatment and intense light irradiation may be performed at the same time for the crystallization. In view of productivity, crystallization is desirably performed by intense light irradiation.

In the crystalline semiconductor film obtained in such a manner, the metal element (nickel here) remains. Although the metal element is not uniformly distributed in the film, it remains at a concentration over $1 \times 10^{19}$ atoms/cm$^3$ on average. Needless to say, various semiconductor elements such as TFTs can be formed even in such a state; however, the metal element is removed by gettering as will be described later.

Here, a natural oxide film formed in the crystallization step is removed before laser light irradiation. This natural oxide film contains nickel at high concentration; therefore, it is preferably removed.

Then, in order to increase the degree of crystallization (degree of the crystallized component in the total volume of the film) and compensate defects remaining in the crystal grains, the crystalline semiconductor film is irradiated with laser light. In the case of irradiating the crystalline semiconductor film with laser light, distortions or ridges are formed in the semiconductor film, and a thin surface oxide film (not shown) is formed over the surface. As the laser light, excimer laser light of a wavelength of 400 nm or less that is emitted from a laser light source which is a pulse oscillator, and the second or third harmonic of a YAG laser may be employed. Alternatively, the second to fourth harmonics of the fundamental wave may be utilized with a solid-state laser capable of continuous wave oscillation. Typically, the second harmonic (532 nm) or the third harmonic (355 nm) of an Nd:YVO$_4$ laser (fundamental wave: 1064 nm) may be employed.

Subsequently, first heat treatment to reduce distortions of the crystalline semiconductor film (heat treatment for heating the semiconductor film up to about 400 to 1000° C. momentarily) is performed in a nitrogen atmosphere, thereby obtaining a flat semiconductor film. As the heat treatment for heating momentarily, heat treatment by intense light irradiation or heat treatment in which the substrate is put into a heated gas and taken out after a few minutes may be employed. Depending on the condition of the heat treatment, as well as the distortions are reduced, defects remained in the crystal grains are compensated, that is, crystallinity can be improved. Further, since the distortions are reduced by this heat treatment, nickel can be easily gettered in a later gettering step. It is to be noted that, when the temperature in this heat treatment is lower than the temperature in the crystallization, nickel moves into the silicon film while keeping the solid-phase state.

Then, a semiconductor film containing a rare gas element is formed over the crystalline semiconductor film. Before forming the semiconductor film containing a rare gas element, an oxide film to serve as an etching stopper (called a barrier layer) may be formed with a thickness of 1 to 10 nm. The barrier layer may be formed at the same time by the heat treatment to reduce distortions of the semiconductor film.

The semiconductor film containing a rare gas element is formed by plasma CVD or sputtering, thereby forming a gettering site with a thickness of 10 to 300 nm. As the rare gas element, one or plural kinds selected from helium (He), neon (Ne), argon (Ar), krypton (Kr) and xenon (Xe) is used, and particularly, argon (Ar) that is an inexpensive gas is preferable.

Here, PCVD is used. As a material gas, monosilane and argon are used, of which ratio (monosilane:argon) is controlled to be 0.1:99.9 to 1:9, preferably, 1:99 to 5:95 to form the semiconductor film. RF power density in the film-formation is preferably 0.0017 to 0.48 W/cm$^2$. It is preferable that the RF power density be as high as possible because the quality of the film is improved enough to obtain gettering effect, and besides, the film-formation rate is improved. In addition, it is preferable that the pressure during the film-formation be controlled to be 1.333 Pa (0.01 Torr) to 133.322 Pa (1 Torr). The higher the pressure is, the more the film-formation rate is improved, whereas Ar concentration contained in the film is reduced when the pressure is high. Further, the film-formation temperature is preferably 300 to 500° C. In this manner, the semiconductor film can be formed by plasma CVD, which contains argon at a concentration of $1 \times 10^{18}$ to $1 \times 10^{22}$ atoms/cm$^3$, preferably $1 \times 10^{20}$ to $1 \times 10^{21}$ atoms/cm$^3$. By controlling the condition of forming the second semiconductor film within the above-described range, damage on the barrier layer during the film-formation can be reduced so that variation in thickness of the semiconductor film and defects such as holes formed in the semiconductor film can be prevented.

There are two meanings of the inclusion of ions of a rare gas element that is an inert gas in the film: one is that a dangling bond is formed to give distortion to the semiconductor film, and the other is that distortion is given between lattices of the semiconductor film. In order to give the distortion between lattices of the semiconductor film, it is remarkably effective to use an element that has a larger atomic radius than that of silicon, such as argon (Ar), krypton (Kr), or xenon (Xe). In addition, by containing the rare gas element into the film, not only lattice distortion but also a dangling bond is formed to contribute to gettering action.

Subsequently, heat treatment is performed for gettering to reduce the concentration of the metal element (nickel) in the crystalline semiconductor film, or removing the metal element. As the heat treatment for gettering, treatment using intense light irradiation, heat treatment using a furnace, or heat treatment in which the substrate is put into a heated gas and taken out after several minutes may be employed; here, the second heat treatment for gettering (heat treatment of heating the semiconductor film up to about 400 to 1000° C. momentarily) is performed in a nitrogen atmosphere.

By this second heat treatment, the metal element moves to the semiconductor film containing a rare gas element, so that the metal element contained in the crystalline semiconductor film covered with a barrier layer is removed or the concentration of the metal element is reduced. The metal element contained in the crystalline semiconductor film moves in a direction that is perpendicular to the substrate surface and toward the semiconductor film containing a rare gas element.

A distance of the move of the metal element in gettering may be a distance of approximately equal to the thickness of the crystalline semiconductor film, and thus, the gettering can be performed in relatively short time. Here, nickel is moved to the semiconductor film containing a rare gas element so that nickel is not segregated in the crystalline semiconductor film, and the gettering is sufficiently performed so that the crystalline semiconductor film contains almost no nickel, that is, the nickel concentration in the film is $1\times10^{18}$ atoms/cm$^3$ or less, preferably $1\times10^{17}$ atoms/cm$^3$ or less. Note that, not only the semiconductor film containing a rare gas element but also the barrier layer functions as a gettering site.

Subsequently, only the semiconductor film containing a rare gas element is selectively removed using the barrier layer as an etching stopper. As a method to selectively etch only the semiconductor film containing a rare gas element, dry etching without using plasma by $ClF_3$, or wet etching using an alkali solution such as an aqueous solution containing hydrazine or tetraethylammonium hydroxide $((CH_3)_4NOH$: abbreviation is TMAH) can be used. It is to be noted that over etching time is made shorter so as to prevent a pin hole from being formed in the crystalline semiconductor film due to this etching.

Next, the barrier layer is removed by an etchant containing hydrofluoric acid.

In addition, before forming the semiconductor film containing a rare gas element, flushing treatment using a flush substance may be performed to remove an impurity such as F in the chamber. The flushing treatment is performed as follows: monosilane is used as a flush substance and introduced continuously into the chamber at a gas flow rate of 8 to 10 SLM for 5 to 20 minutes, preferably 10 to 15 minutes to perform flushing treatment to the substrate surface (also called silane flush). Note that 1 SLM is 1000 sccm, namely 0.06 m$^3$/h.

Through the above steps, a favorable crystalline semiconductor film can be obtained.

After the crystalline semiconductor film is processed into a desired shape by using the first photomask, the resist mask is removed. Subsequently, if necessary, doping of a slight amount of an impurity element (boron or phosphorus) is performed to the semiconductor layer to control the threshold voltage of a TFT; here, ion doping in which diborane ($B_2H_6$) is not mass-separated but plasma-excited is used.

Then, an oxide film on the surface of the semiconductor layer is removed by using an etchant containing hydrofluoric acid, and at the same time, the surface of the semiconductor layer is cleaned.

Next, an insulating film to cover the semiconductor layer is formed. The insulating film is formed by plasma CVD or sputtering with a thickness of 1 to 200 nm. The insulating film is preferably formed to have a small thickness of 10 to 50 nm with a single layer structure or a stacked layer structure of an insulating film containing silicon, and then, surface nitriding treatment using microwave plasma is performed. The insulating film functions as a gate insulating film of a TFT that is formed later.

Subsequently, over the insulating film, a first conductive film with a thickness of 20 to 100 nm and a second conductive film with a thickness of 100 to 400 nm are stacked. In this embodiment mode, a tantalum nitride film with a thickness of 30 nm and a tungsten film with a thickness of 370 nm are sequentially stacked over an insulating film 613, and processing (patterning) as described in Embodiment Mode 1 is performed to form each gate electrode and each wiring.

Note that although the conductive film is the stacked layer of the TaN film and the W film here, the invention is not particularly limited and the conductive film may also be formed of a stacked layer of an element selected from Ta, W, Ti, Mo, Al, and Cu, or an alloy material or a compound material containing the element as a main component. In addition, a semiconductor film typified by a polycrystal silicon film doped with an impurity element such as phosphorus may also be used. Further, the invention is not limited to a two-layer structure, and for example, a three-layer structure in which a tungsten film with a thickness of 50 nm, an aluminum-silicon alloy (Al—Si) film with a thickness of 500 nm, and a titanium nitride film with a thickness of 30 nm are sequentially stacked may also be employed.

ICP (Inductivity Coupled Plasma) etching is preferably used for etching the first conductive film and the second conductive film (first etching treatment and second etching treatment). By using ICP etching and appropriately adjusting the etching condition (e.g., the amount of power applied to a coil-shaped electrode, the amount of power applied to an electrode on a substrate side, or the electrode temperature on the substrate side), the films can be etched into a desired shape.

Then, a first doping step of doping to the entire surface by using the gate electrode as a mask is performed to add an impurity element which imparts n-type conductivity to the semiconductor layer. The first doping step may be performed by ion doping or ion injecting. The ion doping is performed in such a condition that the dose amount is $1.5\times10^{14}$ atoms/cm$^2$ and the accelerating voltage is 60 to 100 kV. As the impurity element which imparts n-type conductivity, phosphorus (P) or arsenic (As) is typically used.

After a mask made of resist is formed, a second doping step of doping to the semiconductor layer with an impurity element which imparts n-type conductivity at a concentration higher than in the first doping step is performed. The mask is provided to protect a source region, a drain region, and a peripheral region thereof of a semiconductor layer for forming a p-channel TFT in a pixel portion, a part of an n-channel TFT in the pixel portion, and a source region, a drain region, and a peripheral region thereof of a semiconductor layer for forming a p-channel TFT in a driver circuit portion.

The second doping step is performed in such a condition that the dose amount is $5\times10^{14}$ to $5\times10^{15}$ atoms/cm$^2$ and the accelerating voltage is 50 to 100 kV. Note that the accelerating voltage in the second doping step is set to be lower than that in the first doping step.

Then, after removing the mask, a mask made of resist is newly formed, and a third doping step of doping the semiconductor layer with an impurity element which imparts p-type conductivity (typically, boron) at high concentration is performed. The mask is provided to protect a source region, a drain region, and a peripheral region thereof of a semiconductor layer for forming the n-channel TFT in the pixel portion, and a source region, a drain region, and a peripheral region thereof of a semiconductor layer for forming an n-channel TFT in the driver circuit portion.

After that, the resist mask is removed. Through the above steps, an impurity region having n-type or p-type conductivity is formed in each semiconductor layer.

Subsequently, an insulating film containing hydrogen is formed by LPCVD, plasma CVD, or the like, and then activation and hydrogenation of the impurity element added to the semiconductor layer are performed. As the insulating film containing hydrogen, a silicon nitride oxide film (SiNO film) obtained by PCVD is used. Thickness of the insulating film containing hydrogen is 50 to 200 nm here. It is to be noted that the insulating film containing hydrogen is a first layer of an interlayer insulating film and contains silicon oxide.

Then, an inorganic insulating film which is a second layer of the interlayer insulating film is formed by sputtering, LPCVD, plasma CVD, or the like. As the inorganic insulating film, a single layer or a stacked layer of an insulating film such as a silicon oxide film, a silicon nitride film or a silicon oxynitride film is used. Thickness of the inorganic insulating film is 600 to 800 nm here.

Next, a mask made of resist is formed by using a photomask, and the insulating film is selectively etched to form a contact hole. Then, the mask made of resist is removed.

After a metal film is stacked by sputtering, a mask made of resist is formed by using a photomask, and the metal stacked layer film is selectively etched, thereby forming an electrode functioning as a source electrode or a drain electrode of a TFT. Note that the metal stacked layer film is continuously formed in the same metal sputtering apparatus. Then, the mask made of resist is removed.

Through the above steps, top gate TFTs 636, 637, 638 and 639 each including a polysilicon film as an active layer can be manufactured over the same substrate.

It is to be noted that the TFT 638 provided in the pixel portion is an n-channel TFT having a plurality of channel formation regions in one TFT. Further, the TFT 638 is a double gate TFT. In addition, in the pixel portion, the TFT 639 electrically connected to a light-emitting element that is formed later is provided; although a double gate p-channel TFT is described as the TFT 639 here in order to reduce off current, the invention is not particularly limited and a single gate TFT may also be used. Note that a double gate structure means such a structure that two gates are provided, in which two TFTs are connected in series and respective gate electrodes of the TFTs are connected. Comparing with a single gate structure, the double gate structure can further reduce off current.

The TFT 636 provided in the driver circuit portion is an n-channel TFT having two low-concentration impurity regions (also called Lov regions) having different widths on both sides of a channel formation region respectively. The two low-concentration impurity regions overlap with a gate electrode in a self-aligned manner. In addition, the TFT 637 is a p-channel TFT having low-concentration impurity regions (Lov regions) having the same width on both of a source side and a drain side. Each of the TFTs is a single gate TFT. In the driver circuit portion, a CMOS circuit is constituted by connecting the TFTs 636 and 637 complementarily, thereby achieving various kinds of circuits. If necessary, a multi gate TFT can be formed.

Then, a first electrode 623, that is, an anode (or a cathode) of a light-emitting element is formed. As the first electrode 623, a single layer film or a stacked layer film of a material having a high work function such as an element selected from Ni, W, Cr, Pt, Zn, Sn, In and Mo, or an alloy material containing the element as a main component such as TiN, $TiSi_xN_y$, $WSi_x$, $WN_x$, $WSi_xN_y$, or NbN may be used to have a total thickness of 100 to 800 nm.

Specifically, the first electrode 623 may be formed by using a transparent conductive film formed of a light-transmitting conductive material, and indium oxide containing tungsten oxide, indium zinc oxide containing tungsten oxide, indium oxide containing titanium oxide, indium tin oxide containing titanium oxide, or the like can be used. Needless to say, indium tin oxide (ITO), indium zinc oxide (IZO), indium tin oxide into which silicon oxide is added (ITSO), or the like can also be used.

An example of a composition ratio in each light-transmitting conductive material is described below. As for the composition ratio of indium oxide containing tungsten oxide, tungsten oxide may be 1.0 wt % and indium oxide may be 99.0 wt %. As for the composition ratio of indium zinc oxide containing tungsten oxide, tungsten oxide may be 1.0 wt %, zinc oxide may be 0.5 wt %, and indium oxide may be 98.5 wt %. As for the composition ratio of indium oxide containing titanium oxide, titanium oxide may be 1.0 to 5.0 wt % and indium oxide may be 99.0 to 95.0 wt %. As for the composition ratio of indium tin oxide (ITO), tin oxide may be 10.0 wt % and indium oxide may be 90.0 wt %. As for the composition ratio of indium zinc oxide (IZO), zinc oxide may be 10.7 wt % and indium oxide may be 89.3 wt %. Further, as for the composition ratio of indium tin oxide containing titanium oxide, titanium oxide may be 5.0 wt %, tin oxide may be 10.0 wt %, and indium oxide may be 85.0 wt %. The composition ratios as described above are just examples, and the composition ratio may be set appropriately.

Then, an insulating film (e.g., an organic resin film) obtained by a coating method is processed by etching or the like to form an insulator 629 (called a bank, a partition wall, a barrier, an embankment, or the like) covering an end portion of the first electrode 623. Note that the insulator 629 is not limited to be formed by processing using a mask, and may also be formed only by light exposure and development using a photosensitive material.

Then, a EL layer (light emitting layer) 624 is formed by an evaporation method or a coating method.

The EL layer (light emitting layer) 624 is a stacked layer, and a buffer layer may be used as one layer of the EL layer (light emitting layer) 624. The buffer layer is formed using a composite material of an organic compound and an inorganic compound, and the inorganic compound has an electron-accepting property with respect to the organic compound. As the inorganic compound, one or a plurality of titanium oxide, zirconium oxide, hafnium oxide, vanadium oxide, niobium oxide, tantalum oxide, chromium oxide, molybdenum oxide, tungsten oxide, manganese oxide and rhenium oxide can be used. The buffer layer may be formed of a composite material of an organic compound having a hole-transporting property and an inorganic compound.

For example, a stacked EL layer (light emitting layer) (a stacked layer of a buffer layer and an EL layer) is preferably provided between the first electrode 623 and a second electrode. The buffer layer is a composite layer including metal oxide (e.g., molybdenum oxide, tungsten oxide, or rhenium oxide) and an organic compound. The organic compound is a material having a hole-transporting property such as 4,4'-bis[N-(3-methylphenyl)-N-phenylamino]biphenyl (abbreviation: TPD), 4,4'-bis[N-(1-naphthyl)-N-phenylamino]biphenyl (abbreviation: α-NPD), or 4,4'-bis{N-[4-(N,N-di-m-tolylamino)phenyl]-N-phenylamino}biphenyl (abbreviation: DNTPD). Further, for an EL layer which is provided on the buffer layer, for example, tris(8-quinolinolato)aluminum (abbreviation: $Alq_3$), tris(4-methyl-8-quinolinolato)aluminum (abbreviation: Almq$_3$), or α-NPD can be used. In addition, a dopant material may also be contained in the EL layer, and for example, N,N'-dimethylquinacridone (abbreviation: DMQd), coumarin 6, or rubrene can be used. The stacked EL layer (light emitting layer) provided between the first electrode and the second electrode may be formed by an evaporation method such as a resistance heating method.

By adjusting thickness of the buffer layer, a distance between the first electrode and the EL layer can be controlled, and light-emitting efficiency can be enhanced. By adjusting the thickness of the buffer layer, an excellent image in which a light-emission color of each light-emitting element is clearly displayed can be displayed and a light-emitting device with low power consumption can be achieved.

Next, a second electrode 625, that is, a cathode (or an anode) of the light-emitting element is formed. As the second electrode 625, an alloy such as MgAg, MgIn, or AlLi, or a transparent conductive film (e.g., ITO) is used.

Then, a protective layer 626 is formed by an evaporation method or sputtering. The protective layer 626 protects the second electrode 625. When light-emission of a light-emitting element is extracted through the protective layer 626, a transparent material is preferably used. Note that a third electrode for protecting the second electrode may be formed between the protective layer 626 and the second electrode 625. If not necessary, the protective layer 626 is not required to be provided.

Subsequently, a sealing substrate 633 is attached with a sealing material 628 to seal a light-emitting element. In other words, the light-emitting display device is sealed by a pair of substrates by surrounding a display region with the sealing material. The interlayer insulating film of a TFT is provided over the entire surface of the substrate; therefore, in the case where a pattern of the sealing material is drawn inside the periphery of the interlayer insulating film, moisture or an impurity may enter from part of the interlayer insulating film that is positioned outside the pattern of the sealing material. Thus, the periphery of the insulating film that is used as an interlayer insulating film of a TFT is provided inside the pattern of the sealing material, preferably so as to overlap the pattern of the sealing material so that the sealing material covers an end portion of the insulating film. A region surrounded with the sealing material 628 is filled with a filler 627. Alternatively, the region surrounded with the sealing material 628 is filled with a dry inert gas.

Finally, an FPC (Flexible Print Circuit) 632 is attached to a terminal electrode by a known method through an anisotropic conductive film 631. A cross-sectional diagram at this stage is shown in FIG. 5. Note that as for the terminal electrode, a transparent conductive film that is obtained by the same step as the first electrode 623 is preferably used as the top layer and is formed over a terminal electrode which is formed at the same time as a gate wiring.

Figure 5:
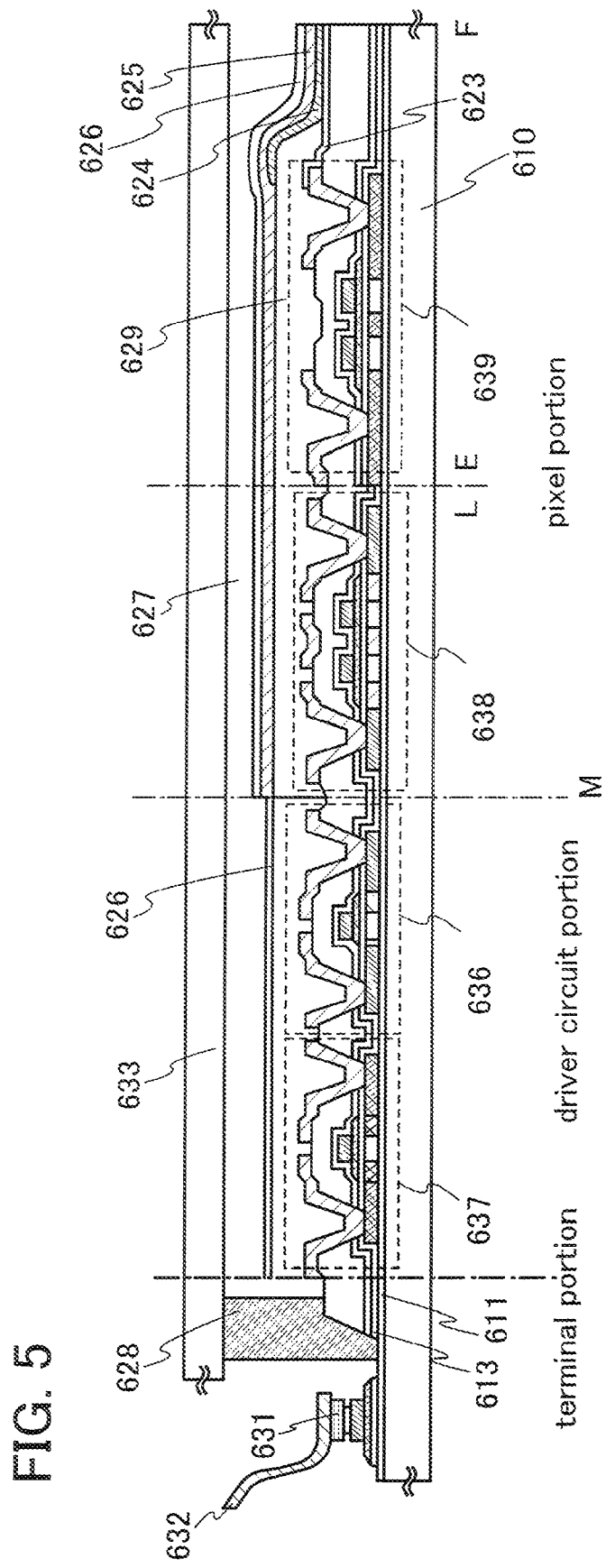
FIG. 5 is a cross-sectional diagram of a light-emitting device.
Figure 6:
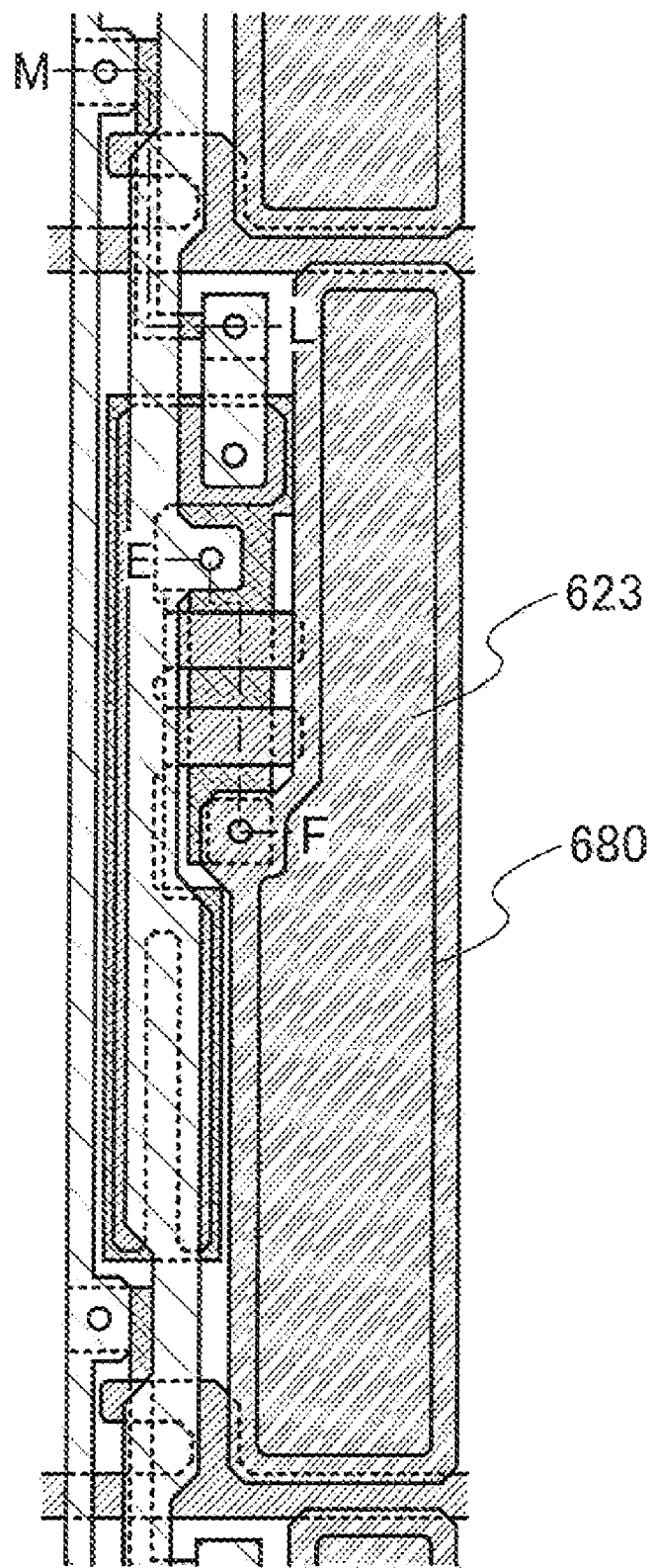
FIG. 6 is a top-plan diagram of a pixel portion.

FIG. 6 is a top-plan diagram of the pixel portion, and a cross-section taken along a chain line E-F in FIG. 6 corresponds to a cross-sectional structure of the p-channel TFT 639 in the pixel portion of FIG. 5. In addition, a cross-section taken along a chain line M-L in FIG. 6 corresponds to a cross-sectional structure of the n-channel TFT 638 in the pixel portion of FIG. 5. It is to be noted that a solid line denoted by reference numeral 680 in FIG. 6 indicates the peripheral border of the insulator 629. Since only the first electrode 623 is shown in FIG. 6, the EL layer, the second electrode, and the like that are formed over the first electrode 623 are not shown.

Through the above steps, the pixel region, the driver circuit and the terminal portion can be formed over the same substrate.

In this embodiment mode, a double gate structure is employed for the TFT in the pixel portion in order to reduce off current, and a TFT in which LDD regions having different widths are provided on both sides of the channel formation region respectively is used as the n-channel TFT in the driver circuit.

In addition, in the light-emitting device, a light-emitting display surface may be provided on either one side or both sides. In the case where both of the first electrode 623 and the second electrode 625 are formed using a transparent conductive film, light of the light-emitting element is extracted through the substrate 610 and the sealing substrate 633 to both sides. In this case, for the sealing substrate 633 and the filler 627, a transparent material is preferably used.

Alternatively, in the case where the second electrode 625 is formed of a metal film and the first electrode 623 is formed of a transparent conductive film, obtained is a structure in which light of the light-emitting element is extracted through only the substrate 610 to one side, namely a bottom emission structure. In this case, for the sealing substrate 633 and the filler 627, a transparent material is not necessarily used.

Further alternatively, in the case where the first electrode 623 is formed of a metal film and the second electrode 625 is formed of a transparent conductive film, obtained is a structure in which light of the light-emitting element is extracted through only the sealing substrate 633 to one side, namely a top emission structure. In this case, for the substrate 610, a transparent material is not necessarily used.

Materials for the first electrode 623 and the second electrode 625 are required to be selected considering work function. Each of the first electrode 623 and the second electrode 625 can be either an anode or a cathode depending on a pixel structure. In the case where polarity of a driving TFT is a p-channel type, the first electrode may be an anode and the second electrode may be a cathode. In the case where polarity of the driving TFT is an n-channel type, the first electrode may be a cathode and the second electrode may be an anode.

Figure 7:
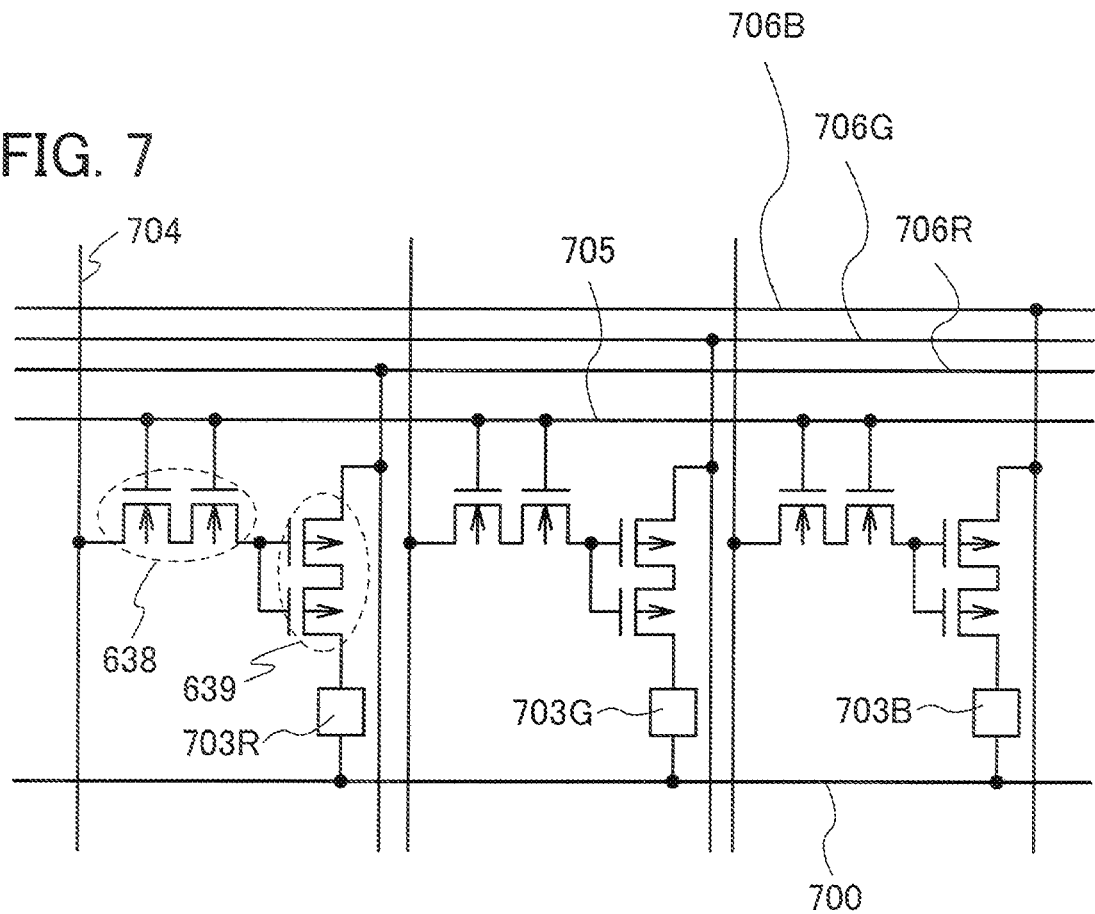
FIG. 7 is a diagram showing an equivalent circuit of the pixel portion.

FIG. 7 is an equivalent circuit diagram of the pixel portion of this embodiment mode in the case of a full color display. A TFT 638 in FIG. 7 corresponds to the switching TFT 638 in FIG. 5, and a TFT 639 corresponds to the current control TFT 639 in FIG. 5. In a pixel for displaying a red color, an OLED 703R emitting red light is connected to a drain region of the current control TFT 639, and a source region thereof is connected to an anode side power supply line (R) 706R. In addition, the OLED 703R is connected to a cathode side power supply line 700. In a pixel for displaying a green color, an OLED 703G emitting green light is connected to a drain region of the current control TFT, and a source region thereof is connected to an anode side power supply line (G) 706G. In addition, in a pixel for displaying a blue color, an OLED 703B emitting blue light is connected to a drain region of the current control TFT, and a source region thereof is connected to an anode side power supply line (B) 706B. Different voltage is applied to the pixels for emitting different colors in accordance with EL materials respectively.

In addition, in the light-emitting device, a driving method for image display is not particularly limited, and for example, a dot sequential driving method, a line sequential driving method, an area sequential driving method or the like may be employed. Typically, the line sequential driving method is used, and besides, a time division gray scale driving method or an area gray scale driving method may be appropriately employed. Further, a video signal input to the source line of the light-emitting device may be either an analog signal or a digital signal, and in accordance with the video signal, the driver circuit and the like may be appropriately designed.

Further, in the case of the light-emitting device using a digital video signal, a video signal that is input into a pixel has either constant voltage (CV) or constant current (CC). As for the video signal with constant voltage (CV), there are cases where voltage of a signal that is applied to a light-emitting element is constant (CVCV) and where current of a signal that is applied to a light-emitting element is constant (CVCC). In addition, as for the video signal with constant current (CC), there are cases where voltage of a signal that is applied to a light-emitting element is constant (CCCV) and where current of a signal that is applied to a light-emitting element is constant (CCCC).

Further, in the light-emitting device, a protective circuit (e.g., a protective diode) for preventing electrostatic breakdown may also be provided.

Further, although a double gate structure is employed for each of the switching TFT and the current control (driving) TFT for correspondence to FIG. 5 here, a p-type or an n-type single gate structure may also be employed for either one or both of the TFTs of course.

Further, although the description is made on the case of an active matrix light-emitting device as a display device here, the invention can also be applied to an active matrix liquid crystal display device. In the case of applying the invention to a liquid crystal display device, the exposure mask provided with a semi-transparent film of the invention is used in forming TFTs used in a pixel portion and a driver circuit portion of the liquid crystal display device. By performing a process such as etching by using such a resist that has at least two regions with different thicknesses and an edge having a gentle shape, gate electrodes or the like with different thicknesses can be formed in a self-aligned manner. Further, the invention can also be applied when a contact hole to reach a source or drain electrode is formed in an interlayer insulating film formed over the gate electrode. Therefore, electrodes having different shapes, opening portions with different depths, or the like can be formed without increasing the number of manufacturing steps. Consequently, elements can be integrated to be provided in accordance with circuit characteristics.

This embodiment mode can be freely combined with any of Embodiment Modes 1 and 2.

Embodiment Mode 4

Further, the case where the photomask or reticle provided with a halftone mask is used for forming a pattern of a gate wiring is described in Embodiment Modes 1 to 3; however, the photomask or reticle provided with a halftone mask can also be used for forming a contact opening in an interlayer insulating film.

Figure 8A:
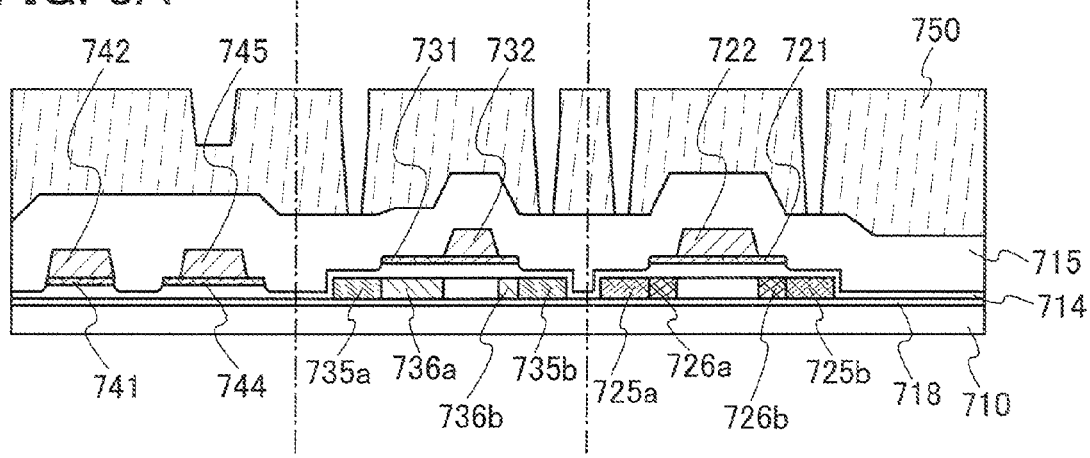
FIGS. 8A to 8C are cross-sectional diagrams for showing manufacturing steps of a light-emitting device.
Figure 8B:
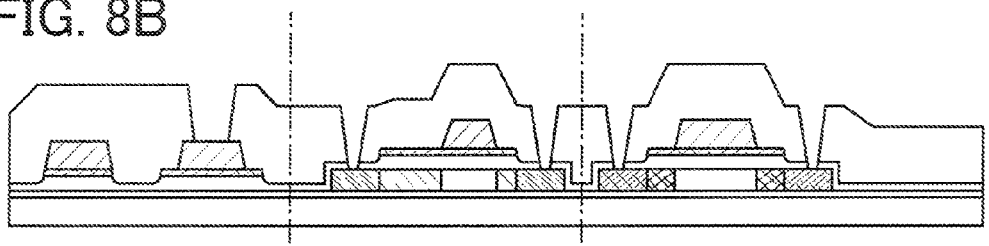
Figure 8C:
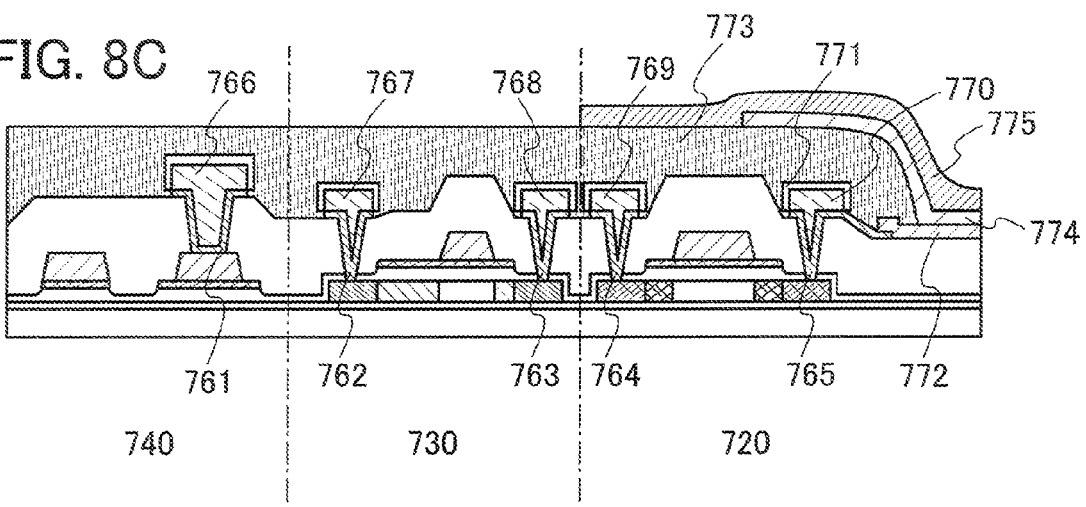

This embodiment mode describes the case where the photomasks or reticles provided with the halftone masks of the invention are used for forming gate electrodes, forming contact openings in an interlayer insulating film, and for forming pattern of connection wirings, with reference to FIGS. 8A to 8C.

In accordance with Embodiment Mode 2, after a base insulating film 718 is provided over a substrate 710 having an insulating surface, a semiconductor layer and a gate insulating film 714 covering the semiconductor layer are formed. Then, a first conductive film and a second conductive film are stacked. A resist pattern is formed using a photomask or a reticle provided with an assistant pattern having a function of reducing light intensity, and is etched to form a gate electrode and a wiring.

Here, similarly to Embodiment Modes 1 to 3, a first conductive layer 731 and a second conductive layer 732 are formed in a first TFT portion 730, and a first conductive layer 721 and a second conductive layer 722 are formed in a second TFT portion 720. Note that respective electrode structures are already described in Embodiment Modes 1 to 3, therefore, specific description thereof is omitted here.

In addition, as shown in FIG. 8A, in a wiring portion and a contact portion 740, a region which is in contact with an upper wiring has such a shape that the width of a first conductive layer 744 is larger than that of a second conductive layer 745. Thus, even when there occurs alignment deviation to the upper wiring, contact with the first conductive layer can be obtained. Further, a wiring except in the region for contact, has such a shape that respective end portions of a first conductive layer 741 and a second conductive layer 742 are in alignment.

Then, after a resist pattern covering the second TFT portion 720 is formed, an impurity element which imparts n-type conductivity is added to the semiconductor layer. By this addition of the impurity element which imparts n-type conductivity, a drain region 735a, a source region 735b, a first LDD region 736a, and a second LDD region 736b are formed in a self-aligned manner. Note that the addition of the impurity element which imparts n-type conductivity may be performed either by one doping treatment or by plural times doping treatments.

As shown in FIG. 8A, the width of the first LDD region 736a is larger than that of the second LDD region 736b in a channel length direction. In addition, the first LDD region 736a and the second LDD region 736b overlap the first conductive layer 731 with the gate insulating film 714 interposed therebetween.

Then, after the resist pattern is removed, a resist pattern covering the first TFT portion 730 is formed. An impurity element which imparts p-type conductivity is added to the semiconductor layer. By this addition of the impurity element which imparts p-type conductivity, a drain region 725a, a source region 725b, a third LDD region 726a, and a fourth LDD region 726b are formed in a self-aligned manner.

As shown in FIG. 8A, respective widths of the third LDD region 726a and the fourth LDD region 726b are approximately the same in a channel length direction. In addition, the third LDD region 726a and the fourth LDD region 726b overlap the first conductive layer 721 with the gate insulating film 714 interposed therebetween.

In addition, the order of adding the impurity elements is not particularly limited; for example, the impurity element which imparts p-type conductivity may be added to the semiconductor layer first and then, the impurity element which imparts n-type conductivity may be added to the semiconductor layer.

Then, after activation of the impurity elements added to the semiconductor layer is performed, an interlayer insulating film 715 is formed and over that, a resist film is applied.

Subsequently, using a photomask or a reticle provided with an assistant pattern having a function of reducing light intensity, light exposure and development of the resist film are performed, to form a resist pattern 750 shown in FIG. 8A. The resist pattern 750 is a mask for forming an opening in the lower insulating film, and owing to the photomask or reticle provided with an assistant pattern having a function of reducing light intensity, openings with different depths can be provided.

Then, etching is performed using the resist pattern 750 to form an opening in the interlayer insulating film 715 and the gate insulating film 714. According to this etching, opening formation in the interlayer insulating film 715 and the gate insulating film 714 is performed while etching the resist pattern 750, thereby forming openings with different depths.

Then, the resist pattern is removed. A cross-sectional diagram at this stage is shown in FIG. 8B.

Subsequently, a staked layer of a third conductive layer (e.g., a titanium nitride film) and a fourth conductive layer (e.g., an aluminum film) is formed. Patterning is performed, thereby forming a third conductive layer 761 of a connection wiring, a fourth conductive layer 766 of the connection wiring, a third conductive layer 762 of a drain wiring, a fourth conductive layer 767 of the drain wiring, a third conductive layer 763 of a source wiring, and a fourth conductive layer 768 of the source wiring. In addition, in the second TFT portion, a third conductive layer 765 of a connection electrode, a fourth conductive layer 770 of the connection electrode, a third conductive layer 764 of a source electrode, and a fourth conductive layer 769 of the source electrode are formed. Here, the photomask or reticle provided with an assistant pattern having a function of reducing light intensity is used for forming the pattern of the connection electrode. The width of the third conductive layer 765 of the connection electrode is larger than that of the fourth conductive layer 770 of the connection electrode in a channel length direction.

Then, plasma treatment is performed to oxide the fourth conductive layers so that oxide films 771 are formed on surfaces of the fourth conductive layers respectively.

Note that in the case where the fourth conductive layer is oxidized by plasma treatment, the plasma treatment is performed in an oxygen atmosphere (e.g., in an atmosphere of oxygen ($O_2$) and a rare gas (containing at least one of He, Ne, Ar, Kr and Xe), in an atmosphere of oxygen, hydrogen ($H_2$), and a rare gas, or in an atmosphere of dinitrogen monoxide and a rare gas). On the other hand, in the case where the film is nitrided by plasma treatment, the plasma treatment is performed in a nitrogen atmosphere (e.g., in an atmosphere of nitrogen ($N_2$) and a rare gas (containing at least one of He, Ne, Ar, Kr and Xe), in an atmosphere of nitrogen, hydrogen, and a rare gas, or in an atmosphere of $NH_3$ and a rare gas). As the rare gas, for example, Ar can be used. Further, a mixed gas of Ar and Kr may also be used. Therefore, an insulating film formed by plasma treatment contains the rare gas (containing at least one of He, Ne, Ar, Kr and Xe) used in the plasma treatment, and the insulating film contains Ar in the case of using Ar.

In addition, in the case where plasma treatment is performed to the fourth conductive layers, the plasma treatment is performed where electron density is $1 \times 10^{11}$ $cm^{-3}$ or more and electron temperature of plasma is 1.5 eV or less in an atmosphere of the above described gas. More specifically, it is performed where the electron density is in the range of $1 \times 10^{11}$ to $1 \times 10^{13}$ $cm^{-3}$ and the electron temperature of plasma is in the range of 0.5 to 1.5 eV. Since the electron density of plasma is high and the electron temperature in the vicinity of an object to be processed (here, the fourth conductive layer) formed over the substrate is low, damage due to plasma on the object to be processed can be prevented. Further, because of the electron density of plasma as high as $1 \times 10^{11}$ $cm^{-3}$ or more, the oxide film or the nitride film, which is formed by oxidizing or nitriding the object to be processed using the plasma treatment, has excellent uniformity in thickness or the like and dense film quality as compared with a film formed by CVD, sputtering, or the like. In addition, because of the electron temperature of plasma as low as 1.5 eV or less, oxidizing or nitriding treatment can be performed at low temperature as compared with conventional plasma treatment or a thermal oxidation method. For example, oxidizing or nitriding treatment can be sufficiently performed even by plasma treatment at a temperature that is lower than a strain point of a glass substrate by 100° C. or more. Note that as a frequency for forming plasma, a high frequency wave such as a microwave (2.45 GHz) can be used.

Then, an electrode 772 for structuring a light-emitting element is formed. The electrode 772 is provided so as to partially overlap the third conductive layer 765 of the connection electrode, and is electrically connected to the TFT. The electrode 772 may be formed of a single layer film or a stacked layer film of a material having a high work function such as an element selected from Ni, W, Cr, Pt, Zn, Sn, In and Mo, or an alloy material containing the element as a main component such as TiN, $TiSi_xN_y$, $WSi_x$, $WN_x$, $WSi_xN_y$, or NbN to have a total thickness of 100 to 800 nm.

Then, an insulator 773 (called a bank, a partition wall, a barrier, an embankment, or the like) covering an end portion of the electrode 772 for structuring a light-emitting element is formed.

Then, a EL layer (light emitting layer) 774 is formed by an evaporation method or a coating method over the electrode 772.

Next, an electrode 775 which is the other electrode for structuring the light-emitting element is formed over the EL layer (light emitting layer) 774. As for the electrode 775, an alloy such as MgAg, MgIn, or AlLi, or a transparent conductive film (e.g., ITO) may be used.

In this manner, in the second TFT portion 720, the light-emitting element structured by the electrode 772, the EL layer (light emitting layer) 774, and the electrode 775 and a p-channel TFT which is connected to the light-emitting element are formed. As for the TFT which is connected to the light-emitting element, LDD regions with the same width are preferably provided in order to reduce off current.

Further, as for a TFT constituting a part of a buffer circuit of the driver circuit, an n-channel TFT shown in the first TFT portion 730 is preferably provided. The n-channel TFT shown in the first TFT portion 730 can relieve electric field intensity in the vicinity of the drain, thereby suppressing deterioration of the circuit. Furthermore, the n-channel TFT shown in the first TFT portion 730 can reduce parasitic capacitance, thereby reducing power consumption of the circuit.

This embodiment mode can be freely combined with any of Embodiment Modes 1 to 3.

Embodiment Mode 5

Figure 9A:
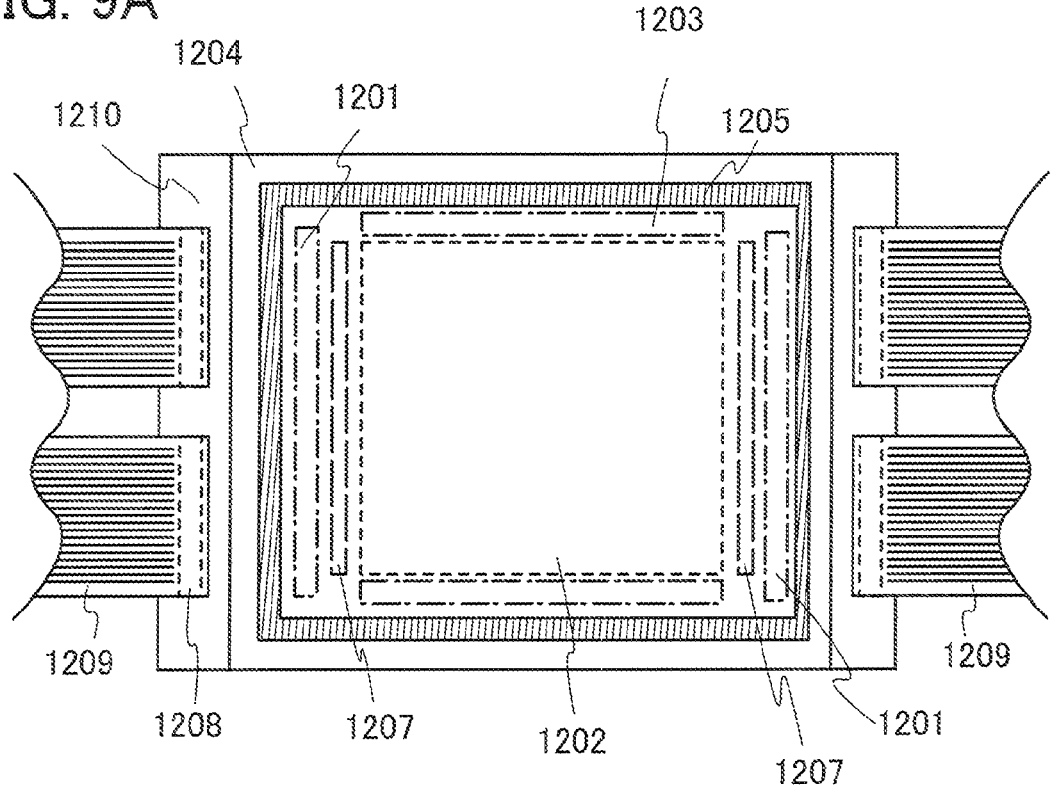
FIGS. 9A and 9B are diagrams each showing an example of a module.
Figure 9B:
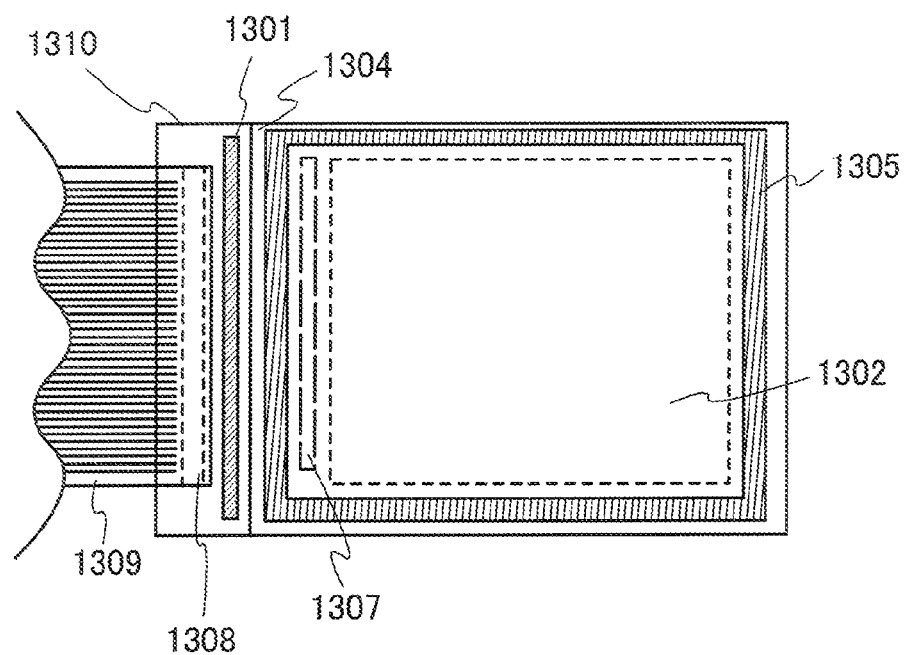

This embodiment mode will describe an example in which an FPC or a driver IC for driving is mounted on a light-emitting display panel with reference to FIGS. 9A and 9B.

FIG. 9A shows an example of a top-plan diagram of a light-emitting device in which FPCs 1209 are attached to four terminal portions 1208 respectively. Over a substrate 1210, a pixel portion 1202 including a light-emitting element and a TFT, a gate driver circuit 1203 including a TFT, and a source driver circuit 1201 including a TFT are formed. An active layer of a TFT is composed of a semiconductor film having a crystal structure, and these circuits are formed over the same substrate. Accordingly, an EL display panel that realizes system-on-panel can be manufactured.

Note that the substrate 1210 is covered with a protective film except for a contact portion, and a base layer containing a substance having a photocatalyst function is provided over the protective film.

In addition, two connection regions 1207 provided on both sides of a pixel portion respectively are provided so that a second electrode of a light-emitting element is in contact with a wiring of a lower layer. A first electrode of the light-emitting element is electrically connected to the TFT provided in the pixel portion.

A sealing substrate 1204 is fixed to the substrate 1210 with a sealing material 1205 surrounding the pixel portion and the driver circuits, and a filler material surrounded by the sealing material. A structure filled with a filler material containing a transparent drying agent may also be employed. Further, a drying agent may also be provided in a region where the pixel portion does not overlap.

Further, the structure shown in FIG. 9A is an example suitable for a light-emitting device having a relatively large size in the XGA class (e.g., 4.3 inches diagonal) whereas FIG. 9B shows an example employing a COG method suitable for a compact size with a narrower frame (e.g., 1.5 inches diagonal).

In FIG. 9B, a driver IC 1301 is mounted over a substrate 1310, and an FPC 1309 is mounted over a terminal portion 1308 provided beyond the driver IC. From an aspect of increasing productivity, a plurality of driver ICs 1301 are preferably formed over a rectangle substrate that is 300 to 1000 mm or more on one side. In other words, a plurality of circuit patterns, each of which has a driver circuit portion and an input/output terminal as one unit, is formed over the substrate and separated so that the driver ICs can be obtained separately. As for the length of the driver IC, the driver IC may be formed to have a rectangular shape having a longer side of 15 to 80 mm and a shorter side of 1 to 6 mm, considering length of one side of the pixel portion or pixel pitch, or may be formed so that the length of the longer side is a length corresponding to one side of a pixel region or a length obtained by adding one side of each driver circuit and one side of the pixel portion to each other.

For the outside dimension, the driver IC has an advantage over an IC chip in the length of the longer side. When a driver IC formed to be 15 to 80 mm on the longer side is used, the number of driver ICs to be required for mounting corresponding to the pixel portion is smaller than the case of using an IC chip, thereby improving the yield in manufacturing. In addition, when a driver IC is formed over a glass substrate, the productivity is not decreased because the driver IC is not limited by the shape of a host substrate. This is a great advantage as compared with a case of taking out IC chips from a circular silicon wafer.

In addition, a TAB (Tape Automated Bonding) method may also be employed and in that case, a plurality of tapes may be attached and driver ICs may be mounted on the tapes. As is in the case of the COG method, a single driver IC may be mounted on a single tape; in this case, a metal piece or the like for fixing the driver IC may be attached together for enhancing strength.

A connection region 1307 provided between a pixel portion 1302 and the driver IC 1301 is provided so that a second electrode of a light-emitting element is in contact with a wiring of a lower layer. A first electrode of the light-emitting element is electrically connected to the TFT provided in the pixel portion.

In addition, a sealing substrate 1304 is fixed to the substrate 1310 with a sealing material 1305 surrounding the pixel portion 1302, and a filler material surrounded by the sealing material.

In the case where an amorphous semiconductor film is used as an active layer of the TFT in the pixel portion, it is difficult to form the driver circuit over the same substrate, thus the structure of FIG. 9B is employed even for a large size.

Although an active matrix light-emitting device is shown as an example of a display device here, the invention can also be applied to an active matrix liquid crystal display device, of course. In the active matrix liquid crystal display device, pixel electrodes arranged in matrix are driven to form a display pattern on the screen. Specifically, voltage is applied to a selected pixel electrode and an opposite electrode corresponding to the pixel electrode, thus a liquid crystal layer between the pixel electrode provided over the element substrate and the opposite electrode provided over the opposite substrate is optically modulated, and the optical modulation is recognized as a display pattern by a viewer. The opposite substrate and the element substrate are arranged at an even interval and the space therebetween is filled with a liquid crystal material. As for the liquid crystal material, a method may be employed in which the liquid crystal material is dropped under reduced pressure so that a bubble does not enter by using the sealing material as a closed pattern and the substrates are attached to each other; alternatively, a dip method (pumping method) may be employed in which the liquid crystal is injected using capillary phenomenon after providing a seal pattern having an opening portion and attaching the TFT substrates.

The invention can also be applied to a liquid crystal display device using a field sequential driving method in which light is shuttered without using a color filter and backlight light sources for three colors of R, G, and B are flashed on and off at high speed.

As described above, by implementing the invention, i.e., by using the manufacturing method or the structure described in any of Embodiment Modes 1 to 4, various electronic devices can be completed.

Embodiment Mode 6

As a semiconductor device and an electronic device manufactured by using the exposure mask of the invention, there are a video camera, a digital camera, a goggle type display (a head mount display), a navigation system, an audio reproducing device (e.g., a car stereo or an audio component system), a notebook personal computer, a game machine, a mobile information terminal (e.g., a mobile computer, a mobile phone, a mobile game machine, or an electronic book), an image reproducing device equipped with a recording medium (specifically, a device for reproducing a recording medium such as Digital Versatile Disc (DVD) and provided with a display for displaying the image), and the like. FIGS. 10A to 10E and 11 show specific examples of the electronic devices.

Figure 10A:
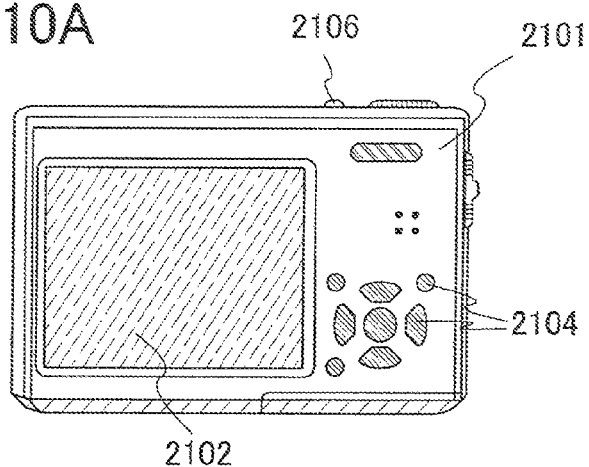
FIGS. 10A to 10E are diagrams each showing an example of an electronic device.

FIG. 10A shows a digital camera, which includes a main body 2101, a display portion 2102, an imaging portion, operating keys 2104, a shutter 2106, and the like. Note that FIG. 10A is a diagram from a display portion 2102 side and the imaging portion is not shown. By using the halftone mask of the invention, a highly reliable digital camera having a high-definition display portion can be achieved. Note that the digital camera shown in FIG. 10A may be a digital camera equipped with a TV capable of displaying a TV screen on the display portion 2102.

Figure 10B:
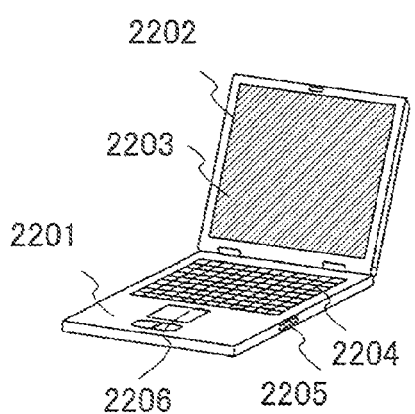

FIG. 10B shows a notebook personal computer, which includes a main body 2201, a chassis 2202, a display portion 2203, a keyboard 2204, an external connection port 2205, a pointing mouse 2206, and the like. By using the halftone mask of the invention, a highly reliable notebook personal computer having a high-definition display portion can be achieved.

Figure 10C:
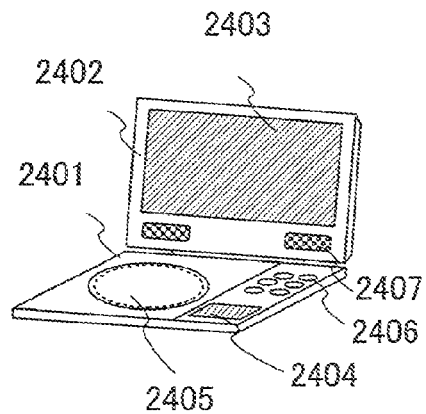

FIG. 10C shows a mobile image reproducing device equipped with a recording medium (specifically a DVD reproducing device), which includes a main body 2401, a chassis 2402, a display portion A 2403, a display portion B 2404, a recording medium (e.g., a DVD) reading portion 2405, operating keys 2406, a speaker portion 2407 and the like. The display portion A 2403 mainly displays image information and the display portion B 2404 mainly displays character information. It is to be noted that the image reproducing device equipped with a recording medium also includes a home game machine. By using the halftone mask of the invention, a highly reliable image reproducing device having a high-definition display portion can be achieved.

Figure 10D:
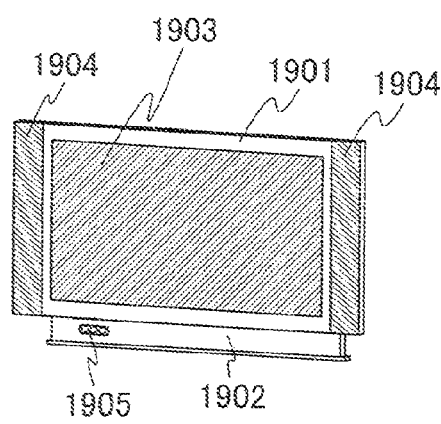

FIG. 10D shows a display device, which includes a chassis 1901, a support 1902, a display portion 1903, speakers 1904, a video input terminal 1905, and the like. The display device is manufactured by using a thin film transistor formed by the manufacturing method described in the above embodiment modes for the display portion 1903 and a driver circuit. Note that, as the display device, there are a liquid crystal display device, a light-emitting device and the like, including all kinds of display devices for displaying information, such as devices for a personal computer, for receiving TV broadcasting, for displaying an advertisement and the like. By using the halftone mask of the invention, a highly reliable display device having a high-definition display portion, particularly a large-sized display device having a large screen of 22 to 50 inches can be achieved.

Further, a thin film integrated circuit having a TFT formed using the halftone mask of the invention can also be used as a non-contact thin film integrated circuit device (also called a wireless IC tag or an RFID (Radio Frequency Identification)) by additionally forming an antenna or the like. By attaching an IC tag to various electronic devices, a distribution channel of such electronic devices can be clarified.

Figure 10E:
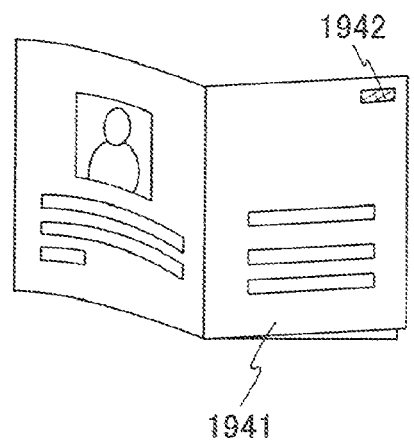

FIG. 10E shows a passport 1941 to which a wireless IC tag 1942 is attached. The wireless IC tag 1942 may also be embedded in the passport 1941. Similarly, the wireless IC tag may be attached to or embedded in a driver's license, a credit card, a banknote, a coin, a certificate, a merchandise coupon, a ticket, a traveler's check (T/C), a health insurance card, a residence certificate, a family register, and the like. In this case, only information showing that this object is a real one is input into the wireless IC tag, and access authority is set so that information is not read or written illegally. By using as the tag as described above, a real object can be distinguished from forged ones. In addition, the wireless IC tag can also be used as a memory. Further, by providing the wireless IC tag for containers for wrapping objects, recording media, personal belongings, foods, clothes, livingware, electronic devices, and the like, a system such as an inspection system can be more effectively carried out.

Figure 11:
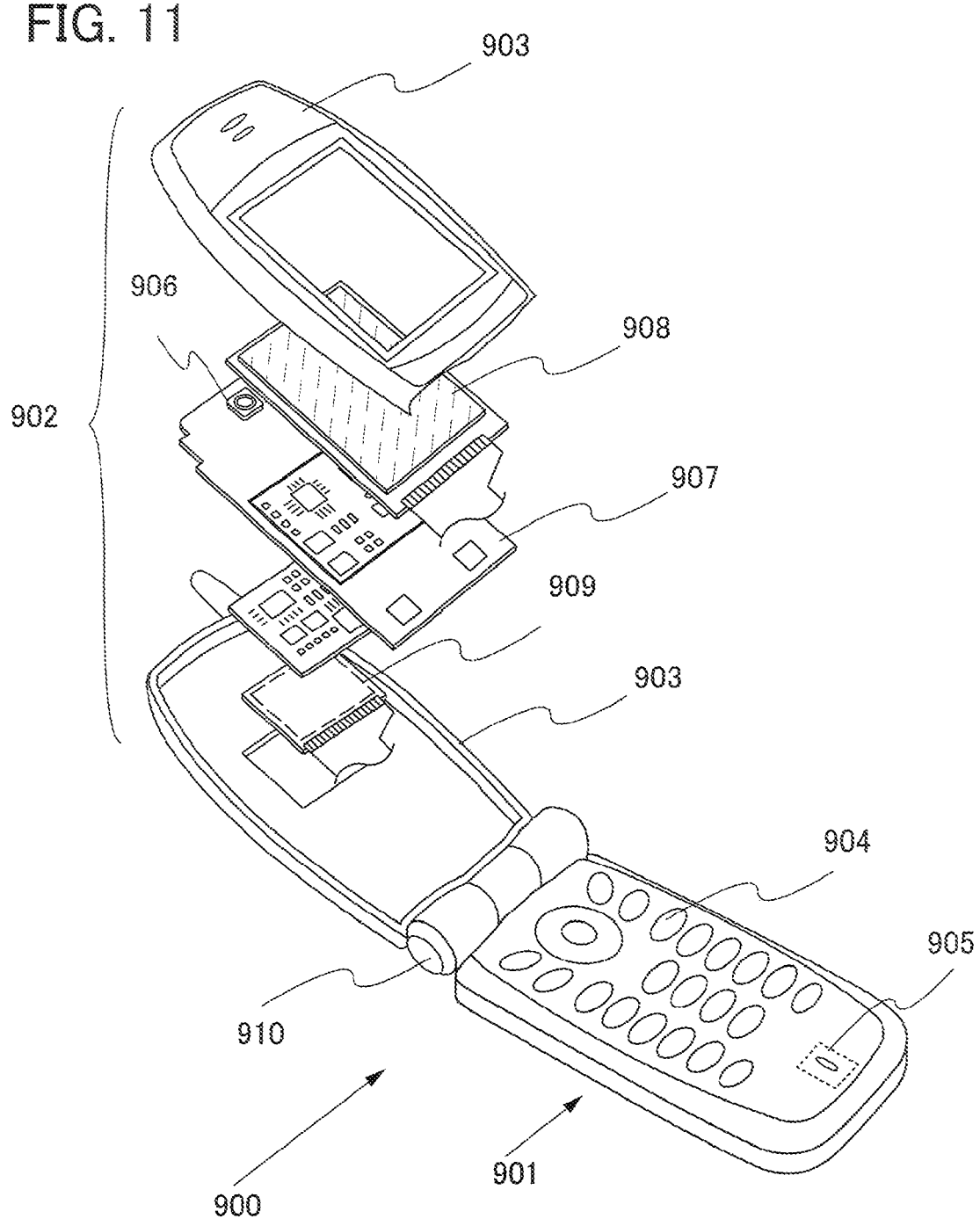
FIG. 11 is a diagram showing an example of an electronic device.

A mobile phone shown in FIG. 11 includes a main body (A) 901 provided with operating switches 904, a microphone 905 and the like, and a main body (B) 902 provided with a display panel (A) 908, a display panel (B) 909, a speaker 906 and the like, and both the main bodies are connected with a hinge 910 so as to open and fold. The display panel (A) 908 and the display panel (B) 909 are incorporated into a chassis 903 of the main body (B) 902 together with a circuit substrate 907. Pixel portions of the display panel (A) 908 and the display panel (B) 909 are arranged so as to be seen from an open window formed in the chassis 903.

The specifications of the display panel (A) 908 and the display panel (B) 909 such as the number of pixels can be appropriately set in accordance with the function of a mobile phone 900. For example, the display panel (A) 908 and the display panel (B) 909 can be used in combination as a main display screen and a sub-display screen respectively.

By using the halftone mask of the invention, a highly reliable mobile information terminal having a high-definition display portion can be achieved.

The mobile phone of this embodiment mode can be changed into various modes in accordance with the function or application. For example, by incorporating an imaging device into the hinge 910, a mobile phone equipped with a camera can be provided. In addition, in the case where the operating switches 904, the display panel (A) 908 and the display panel (B) 909 are incorporated into one chassis, the aforementioned effect can be obtained. Further, in the case where the structure of this embodiment mode is applied to an information display terminal provided with a plurality of display portions, a similar effect can be obtained.

As described above, by implementing the invention, i.e., by using the manufacturing method or the structure described in any of Embodiment Modes 1 to 5, various electronic devices can be completed.

According to the invention, since the phase difference between exposure light which transmits through a transparent region and exposure light which transmits through a halftone film, and the transmittance satisfy a relation of Formula 5 in a halftone mask, a resist which has regions with different thicknesses can have such a shape that a convex portion is not formed in an end portion and the end portion is gentle. By using the halftone mask which satisfies the above condition, various circuits can be formed over the same substrate in a self-aligned manner without increasing the number of manufacturing steps.

This application is based on Japanese Patent Application serial no. 2005234906 filed in Japan Patent Office on 12 Aug. 2005, entire contents of which are hereby incorporated by reference.

What is claimed is:

1. An exposure mask wherein a phase difference $\Delta\theta$ of i-line (365 nm) which transmits through a transparent region and a semi-transparent region and a transmittance n of the semi-transparent region with respect to the exposure light satisfy Formula 1

$$\Delta\theta \leq \arccos(-\sqrt{n}/2).\qquad\text{[Formula 1]}$$

2. An exposure mask wherein a phase difference $\Delta\theta$ of i-line (365 nm) which transmits through a transparent region and a semi-transparent region and a transmittance n of the semi-transparent region with respect to the exposure light satisfy Formula 2, and the transmittance n is in the range of 0.15 to 0.8

$$\Delta\theta \leq \arccos(-\sqrt{n}/2).\qquad\text{[Formula 2]}$$

3. An exposure mask comprising:
 a light-transmitting substrate;
 a semi-transparent film provided over the light-transmitting substrate; and
 a light-shielding film provided over the semi-transparent film,
wherein a phase difference $\Delta\theta$ between the semi-transparent film and the light-transmitting substrate with respect to i-line (365 nm) and a transmittance n of the semi-transparent film with respect to the i-line (365 nm) satisfy Formula 3

$$\Delta\theta \leq \arccos(-\sqrt{n}/2).\qquad\text{[Formula 3]}$$

4. The exposure mask according to claim 3, wherein light-shielding film comprises a Cr film.

5. The exposure mask according to claim 3, wherein an alloy containing Mo and Si, an alloy containing Cr and Si, or Cr is used as a material for the semi-transparent film.

6. The exposure mask according to claim 3, wherein the transmittance of the semi-transparent film with respect to the i-line (365 nm) is in the range of 0.15 to 0.8.

7. An exposure mask comprising:
a light-transmitting substrate;
a semi-transparent film provided over the light-transmitting substrate; and
a light-shielding film provided over the semi-transparent film,
wherein a phase difference between the semi-transparent film and the light-transmitting substrate with respect to i-line (365 nm) is in the range of −90° to 90°.

8. The exposure mask according to claim 7, wherein light-shielding film comprises a Cr film.

9. The exposure mask according to claim 7, wherein an alloy containing Mo and Si, an alloy containing Cr and Si, or Cr is used as a material for the semi-transparent film.

10. The exposure mask according to claim 7, wherein the transmittance of the semi-transparent film with respect to the i-line (365 nm) is in the range of 0.15 to 0.8.

11. A method for manufacturing a semiconductor device comprising a step of:
forming a resist pattern using an exposure mask wherein a phase difference $\Delta\theta$ of i-line (365 nm) which transmits through a transparent region and a semi-transparent region and a transmittance n of the semi-transparent region with respect to the exposure light satisfy Formula 1

$$\Delta\theta \leq \arccos(-\sqrt{n}/2).$$ [Formula 1]

12. The method for manufacturing the semiconductor device according to claim 11, wherein the resist pattern is used for forming gate electrodes.

13. The method for manufacturing the semiconductor device according to claim 11, wherein the resist pattern is used for forming contact holes.

* * * * *